(12) United States Patent
Whetsel

(10) Patent No.: US 7,587,644 B2
(45) Date of Patent: Sep. 8, 2009

(54) SCAN TESTING USING RESPONSE PATTERN AS STIMULUS PATTERN AFTER RESET

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/847,747

(22) Filed: Aug. 30, 2007

(65) Prior Publication Data

US 2007/0294606 A1 Dec. 20, 2007

Related U.S. Application Data

(62) Division of application No. 10/609,757, filed on Jun. 30, 2003, now Pat. No. 7,281,183, which is a division of application No. 10/225,662, filed on Aug. 22, 2002, now Pat. No. 6,594,789, which is a division of application No. 09/864,502, filed on May 24, 2001, now Pat. No. 6,442,721, which is a division of application No. 08/931,791, filed on Sep. 16, 1997, now Pat. No. 6,260,165.

(60) Provisional application No. 60/049,954, filed on Jun. 17, 1997, provisional application No. 60/049,960, filed on Jun. 17, 1997, provisional application No. 60/049,863, filed on Jun. 17, 1997, provisional application No. 60/047,954, filed on Jun. 17, 1997, provisional application No. 60/047,961, filed on May 29, 1997, provisional application No. 60/047,956, filed on May 29, 1997, provisional application No. 60/047,951, filed on May 29, 1997, provisional application No. 60/047,947, filed on May 29, 1997, provisional application No. 60/047,886, filed on May 29, 1997, provisional application No. 60/047,883, filed on May 29, 1997, provisional application No. 60/028,821, filed on Oct. 18, 1996.

(51) Int. Cl.
G01R 31/28 (2006.01)
(52) U.S. Cl. .................................. 714/729; 714/727
(58) Field of Classification Search ......... 714/726–729, 714/734
See application file for complete search history.

(56) References Cited

U.S. PATENT DOCUMENTS 4,780,666 A * 10/1988 Sakashita et al. ............ 714/731

(Continued)

FOREIGN PATENT DOCUMENTS

EP 01863267 A2 * 12/1985

OTHER PUBLICATIONS

"A universal technique for accelerating simulation of scan test patterns" by Oomman et al. This paper appears in: Test Conference, 1996. Proceedings., International Publication Date: Oct. 20-25, 1996 On pp. 135-141 Meeting Date: Oct. 20, 1996-Oct. 25, 1996 ISBN: 0-7803-3541-4 Inspec Accession No. 5539838.*

Primary Examiner—Cynthia Britt
(74) Attorney, Agent, or Firm—Lawrence J. Bassuk; W. James Brady; Frederick J. Telecky, Jr.

(57) ABSTRACT

Scan testing of plural target electrical circuits, such as circuits 1 through N, becomes accelerated by using the scan test response data output from one circuit, such as circuit 1, as the scan test stimulus data for another circuit, such as circuit 2. After reset, a scan path captures the output response data from the reset stimulus from all circuits. A tester then shifts the captured data only the length of the first circuit's scan path while loading the first circuit's scan path with new test stimulus data. The new response data from all the circuits then is captured in the scan path. This shift and capture cycle is repeated until the first circuit is tested. The first circuit is then disabled and any remaining stimulus data is applied to the second circuit. This process is repeated until all the circuits are tested. A data retaining boundary scan cell used in the scan testing connects the output of an additional multiplexer as the input to a boundary cell. The inputs of the additional multiplexer connect to the data input and data output of the boundary cell.

7 Claims, 12 Drawing Sheets

U.S. PATENT DOCUMENTS

| | | | | |
|---|---|---|---|---|
| 4,791,357 A | * | 12/1988 | Hyduke | 324/73.1 |
| 5,568,492 A | * | 10/1996 | Flint et al. | 714/724 |
| 5,596,584 A | * | 1/1997 | Warren | 714/726 |
| 5,623,503 A | * | 4/1997 | Rutkowski | 714/727 |
| 6,260,165 B1 | * | 7/2001 | Whetsel | 714/727 |

* cited by examiner

SELECT = CONVENTIONAL OR WARP SCAN MODE
MODE = CONVENTIONAL BC NORMAL OR TEST MODE CONTROL
CSU = CONVENTIONAL BC CAPTURE, SHIFT, UPDATE CONTROL

SCAN TESTING USING RESPONSE PATTERN AS STIMULUS PATTERN AFTER RESET

This Application claims benefit to:
Provisional Application 60/049,960, filed Jun. 17, 1997;
Provisional Application 60/049,863, filed Jun. 17, 1997;
Provisional Application 60/047,954, filed Jun. 17, 1997;
Provisional Application 60/047,961, filed May 29, 1997;
Provisional Application 60/047,956, filed May 29, 1997;
Provisional Application 60/047,951, filed May 29, 1997;
Provisional Application 60/047,947, filed May 29, 1997;
Provisional Application 60/047,886, filed May 29, 1997;
Provisional Application 60/047,883, filed May 29, 1997; and
Provisional Application 60/028,821, filed Oct. 18, 1996.

This application is a divisional of application Ser. No. 10/609,757, filed Jun. 30, 2003, now U.S. Pat. No. 7,281,183, issued Oct. 9, 2007;

Which was a divisional of application Ser. No. 10/225,662, filed Aug. 22, 2002, now U.S. Pat. No. 6,594,789, granted Jul. 15, 2003;

Which was a divisional of application Ser. No. 09/864,502, filed May 24, 2001, now U.S. Pat. No. 6,442,721, granted Aug. 27, 2002;

Which was a divisional of application Ser. No. 08/931,791, filed Sep. 16, 1997, now U.S. Pat. No. 6,260,165, granted Jul. 10, 2001;

Which claimed priority from Provisional Application No. 60/049,954, filed Jun. 17, 1997.

FIELD OF THE INVENTION

The present invention relates generally to scan testing electrical circuits and, more particularly to a way to expedite scan testing by re-using one circuit's response data as stimulus data to another circuit.

BACKGROUND OF THE INVENTION

Scan testing of circuits is well known. Scan testing configures the circuit into scan cells and combinational logic. Once so configured, the scan cells are controlled to capture test response data from the combinational logic, then shifted to unload the captured test response data from the combinational logic and to load the next test stimulus data to apply to the combinational logic.

FIG. 1 shows an electrical circuit having three memories (M) A,B,C and combinational logic (CL). FIG. 2 shows an example of the memories of FIG. 1 implemented as D flip flops (FF), each memory having a data input, data output, and clock and reset control signals. FIG. 3 shows one example of how the circuit of FIG. 1 can be made scan testable by converting the memories into scan cells and connecting the outputs (D,E,F) of the combinational logic to the scan cell capture inputs. FIG. 4A shows an example of how a D flip flop based memory is converted into a scan cell. The scan cells have a 3:1 multiplexer input to the flip flop. The multiplexer receives selection control (S) to: (1) input the output of the combinational logic to the flip flop (Input1, the capture input), (2) input the external input to the flip flop (Input2, the functional input), or (3) input the serial input to the flip flop (SI, the shift input). The flip flop receives a clock (C) and a reset (R) control input. The scan cells are connected together via their serial input (SI) and serial output (SO) to form a 3-bit scan path through the circuit of FIG. 3. The three scan cells operate as the state memories during functional operation. During test operation, the scan cells operate as scan cells to allow inputting test stimulus to the combinational logic and capturing the response output from the combinational logic. While edge sensitive D flip flop memories are used in this disclosure, level sensitive memories could be used as well. Converting level sensitive memories into scan memories is well known.

In the FIG. 3 example, the scan cells perform both the input of stimulus to the combinational logic and the capture of response from the combinational logic. In other examples of how the circuit may be made scan testable, scan cells could be added to the circuit and scan path, and coupled to the outputs of the combinational logic, as shown in the dotted boxes in FIG. 3. This would allow the input stimulus to be supplied by the converted scan cells (A,B,C) and the output response captured by the added scan cells. Adding scan cells for the purpose of capturing response data adds circuitry. Also if scan cells are added to capture the combinational logic response, the converted scan cells A,B,C do not need Input1 and the feedback connections from the combinational logic outputs.

Also in FIG. 3 a bypass memory (BM) is shown to allow a single bit bypass scan path through the circuit from SI to SO. The use of scan bypass memories is well known. An example of the bypass memory is shown in FIG. 4B. In addition to providing conventional bypassing of the circuit, the bypass memory of the present invention is required to maintain its present state during capture operations, and to always load data from SI regardless of whether it is selected between SI and SO or not. The multiplexer of the bypass memory and the selection (S) control it receives allow these two requirements to be met.

FIG. 5 shows three of the circuits of FIG. 3 connected in series to a tester. The tester outputs data to the serial input of the first circuit (C1) and receives data from the serial output of the last circuit (C3). The tester outputs control to all three circuits to regulate their scan cell's capture and shift operations during each scan test cycle.

FIG. 6 shows the concept of conventional scan testing. In FIG. 6, N circuits are connected on a scan path. A tester controls all circuits C1-N to reset. Following reset, the tester controls all circuits C1-N to capture the first response data to the reset stimulus data. Next the tester controls all circuits C1-N to shift out the first captured response data and shift in the second stimulus data. This process of capturing response data, shifting out the response data while new stimulus data is shifted in is repeated for the number of patterns (P) required to test each of the circuits 1-N. As the number of serially connected circuits (N) grows, so does the length (L) of the scan path the tester needs to traverse during each capture/shift cycle. The test time in clocks, using conventional scan testing, is equal to the sum of the scan path lengths (L) of each circuit (N) in the scan path times the number of patterns (P) to be applied.

Examples 1-9 discussed below are included in the Appendix.

Example 1 shows how three circuits (C1, C2, and C3) are conventionally scan tested by a tester as shown in FIG. 5. The combinational logic decode for each of the circuits C1, C2, and C3 are shown in the Tables of Example 1. The tables show the present state (PS) output (i.e. stimulus) of the scan cells (ABC) to the combinational logic and the next state (NS) input (i.e. response) to the scan cells (ABC) from the combinational logic. At the beginning of the test, the tester outputs control to reset all scan cells to a first present state (PS1). Next, the tester outputs control to all scan cells to do a first capture (CP1) of the response output of the combinational logic (CL) to the PS1 stimulus. Next, the tester outputs control to do a first 9-bit shift operation (SH1) to unload the first captured response data from each circuit's scan cells and to load the second present state (PS2) stimulus data to each circuit's scan cells. Next, the tester does a second capture (CP2) to load the scan cells with the response data from the second present state (PS2) stimulus data, then does a second 9-bit shift (SH2) to unload the second captured response data and load the third stimulus data. Next, the tester does a third capture (CP3) to load the scan cells with the response data from the third present state (PS3) stimulus data, then does a third 9-bit shift (SH3) to unload the third captured response data and load the fourth stimulus data (11). This process continues through an eighth capture (CP8) to load the scan cells with the response data from the eighth present state (PS8) stimulus data, then does an eighth 9-bit shift (SH8) to unload the final captured response data. The data input to the scan cells during the eighth shift (SH8) can be don't care data (x) since testing is complete following the eighth shift. If all circuits are good the response shifted out for each PS1-8 stimulus will match the expected response as shown in the tables for C1, C2, and C3. The number of test clocks for the conventional scan testing of the circuits in example 1 is the sum of the capture clocks (CP1-8) and shift clocks (SH1-8), or 8+(8×9)=80.

It is desirable to scan test electrical circuits in less time than the conventional approach.

The present invention accelerates scan testing by re-using one circuit's scan test response data as scan test stimulus data for another circuit.

DETAILED DESCRIPTION OF THE DRAWINGS

Figure 7:
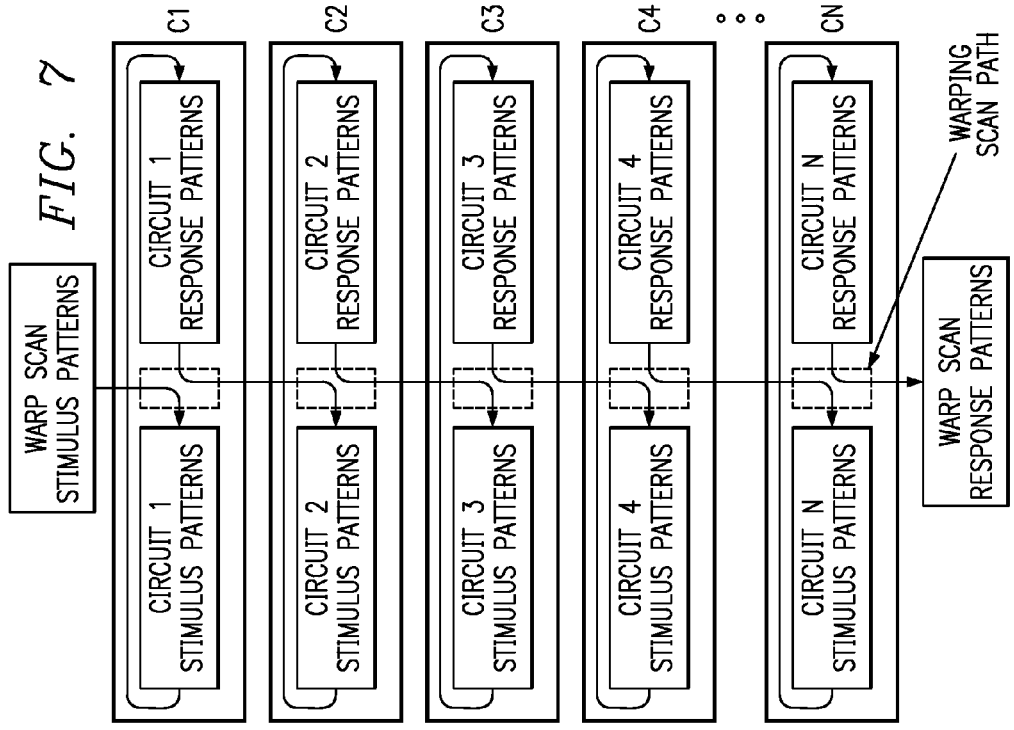
FIGS. 7 and 8 illustrate conceptually a scan testing methodology according to the present invention.
Figure 6:
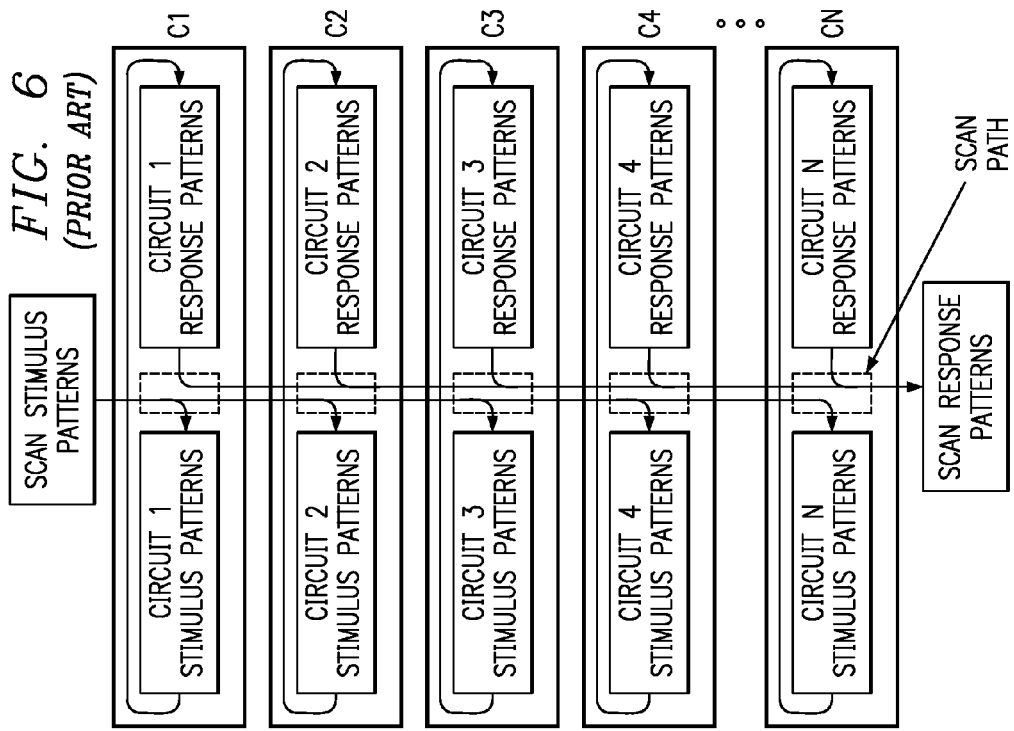

FIG. 7 shows the warping scan test concept of the present invention. The term warping is used to indicate the non-conventional way serial data propagates through circuits during scan testing according to the present invention. In FIG. 7, N circuits are connected on a scan path. A tester controls all circuits C1-N to reset. Following reset, the tester controls all circuits C1-N to capture the first response data to the reset stimulus data. Next the tester controls all circuits C1-N to shift data, but only for the length of the first circuit's (C1) scan path. After the first shift operation, C1's scan path is loaded with stimulus data from the tester and C2-CN's scan path is loaded with the response data from C1-CN−1. During the next capture and shift operation, C1 outputs response data to downstream circuits and receives its next stimulus data from the tester. After the second capture and shift operation, C1, contains its second stimulus data pattern from the tester and C2-CN contain their second stimulus patterns derived from the response output from leading circuits C1-CN−1. This process continues until C1 is tested. After C1 is tested, it is bypassed so that the tester can directly input any remaining stimulus to C2 and allow response from C2 to ripple downstream as stimulus to trailing circuits C3-CN. Similarly, after C2 is tested, it is bypassed to allow direct input of remaining stimulus to C3 while response from C3 is rippled downstream as stimulus to trailing circuits C4-CN. The overall testing of circuits C1-CN in FIG. 7 is complete when all circuits have received their required input stimulus, either indirectly as a result of output response from leading circuits or by direct input from the tester, and have output their response to the tester.

Figure 8:
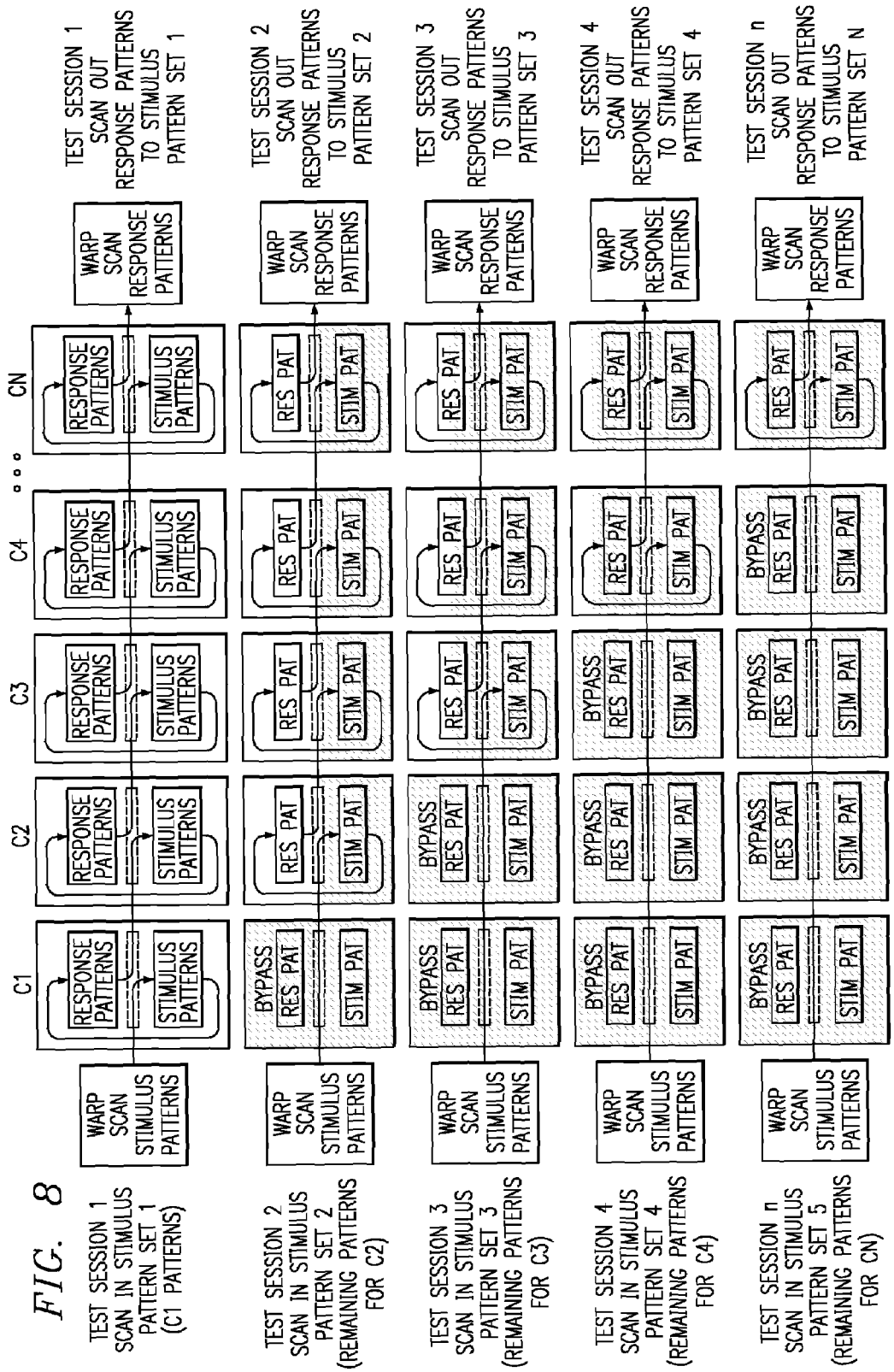

FIG. 8 shows a conceptual flow of the above described warping scan test operation as it progresses across circuits CL-CN. The test sessions of FIG. 8 indicate times when a tester is inputting stimulus to a given circuit scan path, either directly to C1 or through tested and bypassed circuits (C1-CN−1). The shaded area in each circuit C1-CN indicates reduction of remaining stimulus input to a circuit following a given test session. When a circuit is completely tested, it is shown to be bypassed and completely shaded. The progression of the shaded areas of each circuit indicate the test acceleration anticipated by the present invention. For example, following test session 1 (C1 tested), the response generated to downstream circuits C2-CN during test session 1 has reduced their need for additional stimulus patterns from the tester by 50%. Following test session 2 (C2 tested), the response generated to downstream circuits C3-CN during test session 2 has reduced their need for additional stimulus patterns from the tester by another 50%. And so on. The present invention will show that scan test time can be dramatically reduced by using output response from leading circuits as stimulus input to trailing circuits which can reduce or even eliminate the need of stimulus input from the tester.

Figure 4A:
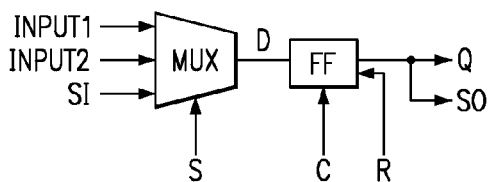
Figure 4B:
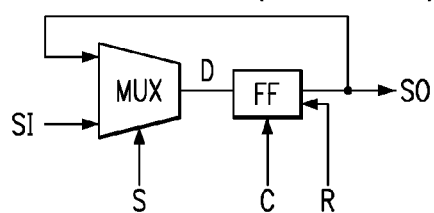

Example 2 shows how the same three circuits (C1,C2,C3) of Example 1 would be tested using the warping scan test concept whereby response data from leading circuits is used as stimulus data in trailing circuits. At the beginning of the test, the tester outputs control to reset or initialize all scan cells to a first present state 1 (PS1). Note that while a reset input is provided on the scan cells to allow the tester to initialize the scan paths by a reset control signal (as seen in FIG. 4A), the tester could also initialize non-resetable scan cells by doing a scan operation. Next, the tester outputs control to all scan cells to do a first capture (CP1) of the response output of the combinational logic (CL) to the first present state (PS1) stimulus. The tester then outputs control to cause all scan cells of circuits C1 through C3 to do a first 3-bit shift operation (SH1). The first 3-bit shift operation unloads the first captured 3-bit response data from C3, moves the first captured 3-bit response data from C1 to C2 and from C2 to C3, and loads the second 3-bit stimulus data into C1.

Next, the tester outputs control to all scan cells to do a second capture (CP2) of the response output of the combinational logic (CL) to the PS2 stimulus. The tester then outputs control to cause all scan cells of circuits C1 through C3 to do a second 3-bit shift operation (SH2). The second 3-bit shift operation unloads the second captured 3-bit response data from C3, moves the second captured 3-bit response data from C1 to C2 and from C2 to C3, and loads the third 3-bit stimulus data into C1.

Next, the tester outputs control to all scan cells to do a third capture (CP3) of the response output of the combinational logic (CL) to the PS3 stimulus. The tester then outputs control to cause all scan cells of circuits C1 through C3 to do a third 3-bit shift operation (SH3). The third 3-bit shift operation unloads the third captured 3-bit response data from C3, moves the third captured 3-bit response data from C1 to C2 and from C2 to C3, and loads the fourth 3-bit stimulus data into C1.

This capture and shift process repeats until the seventh shift operation (SH7). During SH7, the tester unloads the seventh captured 3-bit response from C3, moves the seventh captured 3-bit response data from C1 to C2 and from C2 to C3, and loads the eighth and last, 3-bit stimulus data into C1.

Next the tester outputs control to all scan cells to do an eighth capture (CP8) of the response output of the combinational logic (CL) to the PS8 stimulus. The tester then outputs control to cause all scan cells of circuits C1 through C3 to do an eighth 3-bit shift operation (SH8). The eighth 3-bit shift operation unloads the eighth captured 3-bit response data from C3, moves the eighth captured 3-bit response data from C1 to C2 and from C2 to C3, and inputs the first bit of the first 3-bit C2 stimulus pattern into C1's bypass memory (BM). Note that the serial input during SH8 is 1xx because the leading two bits (xx) will not be used, while the last bit (1) will be stored in C1's bypass memory and be the first bit of the first 3-bit stimulus pattern input to C2 during SH9. As previously mentioned in regard to FIG. 3, the bypass memory always loads the data from SI during shift operations and maintains its data during capture operations. This allows the present invention to use bypass memories as data pipeline bits between the tester and circuit receiving stimulus input from the tester.

Following SH8, C1 is completely tested and the tester outputs control to cause C1's bypass memory to be selected between C1's SI and SO. Also the tester outputs control to cause C1's scan cells to hold (H) their present state for the remainder of the test. At this point, C1 only serves as a data pipeline bit between the tester and the scan path of C2. While C1's scan cells could continue to operate during the remaining tests, doing so would cause C1 to consume non-useful energy and produce heat. The advantage of holding a circuits scan path static to eliminate heat build up after the circuit has been tested will be discussed in more detail in regard to using the present invention to accelerate wafer testing (FIGS. 26-29).

Next the tester outputs control to all scan cells to do a ninth capture (CP9) of the response output of the combinational logic (CL) to the PS9 stimulus. The tester then outputs control to cause all scan cells of circuits C2 and C3 (C1 scan cells are disabled) to do a ninth 3-bit shift operation (SH9). The ninth 3-bit shift operation unloads the ninth captured 3-bit response data from C3, moves the ninth captured 3-bit response data from C2 to C3, and loads C2 with its first 3-bit stimulus pattern (001) from the tester (00) and C1 bypass bit (1). The loading of the 001 stimulus pattern into C2 during SH9 is seen in the dotted circle around the 00 tester input bits and dotted circle around the 1 bit in the C1 bypass memory. The last bit (0) of the 3-bit tester input (000) during SH9 is stored into C1's bypass memory and will be the first bit of the second 3-bit stimulus pattern (100) to C2 during SH10. The 001 stimulus to C2 during SH9 is a stimulus input pattern that is needed for testing C2 but did not occur in C1's output response during SH1-8. The other stimulus patterns that are needed for testing C2 but did not occur in the C1 response patterns are 100 and 111. These stimulus input patterns will be provided to C2 during the following SH10 (100) and SH11 (111) operations.

Next, the tester outputs control to all scan cells to do a tenth capture (CP10) of the response output of the combinational logic (CL) to the PS10 stimulus. The tester then outputs control to cause all scan cells of circuits C2 and C3 to do a tenth 3-bit shift operation (SH10). The tenth 3-bit shift operation unloads the tenth captured 3-bit response data from C3, moves the tenth captured 3-bit response data from C2 to C3, and loads C2 with its second 3-bit stimulus pattern (100) from the tester (10) and C1 bypass bit (0). Again, the loading of the 100 stimulus pattern into C2 during SH10 is seen in the dotted circle around the 10 tester input bits and dotted circle around the 0 bit in the C1 bypass memory. The last bit (1) of the 3-bit tester input (110) during SH10 is stored into C1's bypass memory and will be the first bit of the third 3-bit stimulus pattern (111) to C2 during SH11.

Next, the tester outputs control to all scan cells to do an eleventh capture (CP11) of the response output of the combinational logic (CL) to the PS11 stimulus. The tester then outputs control to cause all scan cells of circuits C2 and C3 to do an eleventh 3-bit shift operation (SH11). The eleventh 3-bit shift operation unloads the eleventh captured 3-bit response data from C3 and moves the eleventh captured 3-bit response data from C2 to C3. Again, the loading of the 111 stimulus pattern into C2 during SH11 is seen in the dotted circle around the 11 tester input bits and dotted circle around the 1 bit in the C1 bypass memory. The last bit (x) of the 3-bit tester input (x11) during SH11 is stored into C1's bypass memory but will not be used for testing because C2's scan path, into which it will be shifted during SH12, will be bypassed following the SH12 operation.

Next, the tester outputs control to all scan cells to do a twelfth capture (CP12) of the response output of the combinational logic (CL) to the PS12 stimulus. The tester then outputs control to cause all scan cells of circuits C2 and C3 to do a twelfth 3-bit shift operation (SH12). The twelfth 3-bit shift operation unloads the twelfth captured 3-bit response data from C3 and moves the twelfth captured 3-bit response data from C2 to C3. Again, the loading of the 0xx stimulus pattern into C2's scan path during SH12 is indicated by the dotted circle around the 0x tester input bits and dotted circle around the x bit in the C1 bypass memory. As mentioned in the above paragraph the data (0xx) loaded into C2 scan path is not used because the scan path will be bypassed following SH12. However, the last two bits of the SH12 tester's 3-bit input (10x), will be a into the bypass memories of C1 (1) and C2 (0), and used as the first two bits of the last remaining 3-bit stimulus pattern input (010) for C3 during SH13.

Following SH12, C2 is completely tested and the tester outputs control to cause C2's bypass memory to be selected between C2's SI and SO. Also the tester outputs control to cause C2's scan cells to hold (H) their present state for the remainder of the test. At this point, C2 only serves as a data pipeline bit between the bypass bit of C1 and scan path of C3.

Next, the tester outputs control to all scan cells to do a thirteenth capture (CP13) of the response output of the combinational logic (CL) to the PS13 stimulus. The tester then outputs control to cause all scan cells of C3 to do a thirteenth 3-bit shift operation (SH13). The thirteenth 3-bit shift operation unloads the thirteenth captured 3-bit response data from C3 and moves the last remaining 3-bit stimulus input (010) from the tester and C1 and C2 bypass bits into C3's scan path. Again, the loading of the 010 stimulus pattern into C3's scan path during SH13 is seen by the dotted circle around the tester's 0 input bit and dotted circles around the 1 and 0 bits in the C1 and C2 bypass memories. Since this is the last required stimulus pattern from the tester, the tester inputs x bits following the 0 bit input during SH13.

Next, the tester outputs control to all scan cells to do a fourteenth capture (CP14) of the response output of the combinational logic (CL) to the PS14 stimulus. The tester then outputs control to cause all scan cells of C3 to do a fourteenth 3-bit shift operation (SH14) to unload the last response output from C3. Following SH14, the test of C3 is complete.

The number of test clocks required to test circuits C1, C2, and C3 using the warping scan test concept is the sum of the capture clocks (CP1-14) and the shift clocks (SH1-14), or 14+(14×3)=56 clocks. This compares with 80 clocks used to test the same circuits using the conventional scan test approach in example 1.

During the testing of C1, C2 was provided with its 000, 010, 011, 110, and 101 stimulus inputs from C1 response, i.e. C2 received 5 of its 8 stimulus inputs while C1 was being tested. Also during testing of C1, C3 was provided with its 000, 001, 011, 100, 111, and 110 stimulus inputs from C2 response, i.e. C3 received 6 of its 8 stimulus inputs while C1 was being tested. Note that C3's 001 stimulus input at PS2 was generated by C2 as a response to C2's initial 000 (reset) stimulus input at PS1, so C3's 001 stimulus was generated independently of any stimulus scanned in from the tester. Similarly, C3's 011 stimulus at PS3 originated as C1's response to its 000 (reset) stimulus at PS1, so C3's 011 stimulus was also independent of any stimulus scanned in from the tester. After C1 was bypassed, C2 received its remaining 001, 100, and 111 stimulus inputs from the tester. During the testing of C2, C3 was provided with its 101 stimulus input from C2 response, i.e. C3 received 1 of its 2 remaining stimulus inputs while C2 was being tested. After C2 was bypassed, C3 received its remaining 010 stimulus input. From this it is seen that C2 was 62.5% tested (5 of 8) and C3 was 75% tested (6 of 8) after C1 was tested. Also, it is seen that C3 was 87.5% tested (7 of 8) after C2 was tested.

Although the tester obviously does not receive all response bits from all circuits, it does receive a bit stream that is (1) uniquely predictable based on the circuits under test and the scan path structure, and (2) representative of all responses from all of the circuits under test. Similarly, the tester does not provide all stimulus bits to all circuits, but the stimulus needed from the tester is readily determined based on the circuits under test and the scan path structure.

A diagram showing the contents of the scan path at key times during the test, for example the diagram shown in Example 2, is readily generated as follows. First, all the bit data from PS1 through CP8 is generated by starting with all scanned cells cleared to 0 at PS1, and then filling in the remaining bits based on the C1, C2 and C3 tables and the seven stimulus patterns which must be shifted in at SH1-SH7 to complete the testing of C1. The final response pattern from C1 is captured at CP8.

It is next determined which C2 stimulus patterns still need to be shifted in from the tester to complete the testing of C2. This is done by simply inspecting the bit patterns at PS1-PS8 of the C2 column and at CP8 of the C1 column, and then comparing the inspected bit patterns to the known required set of C2 stimulus patterns. Any C2 stimulus patterns missing from the inspected patterns must be shifted in to C2 from the tester. Next, all bit data from SH8 through CP12 is filled in based on (1) the C2 and C3 tables, (2) the remaining C2 stimulus patterns to be shifted in from the tester, and (3) the fact that the remaining C2 stimulus patterns will be shifted from the tester to C2 via the C1 bypass bit. The final response pattern from C2 is captured at CP12.

It is next determined which C3 stimulus patterns still need to be shifted in from the tester to complete the testing of C3. This is done by simply inspecting the bit patterns at PS1-PS12 of the C3 column and at CP12 of the C2 column, and then comparing the inspected bit patterns to the known required set of C3 stimulus patterns. Any C3 stimulus patterns missing from the inspected bit patterns must be shifted in to C3 from the tester. Next, all bit data from SH12 through CP14 is filled in based on (1) the C3 table, (2) the remaining C3 stimulus pattern, and (3) the fact that the remaining C3 stimulus pattern will be shifted from the tester to C3 via the C1 and C2 bypass bits. The final response pattern from C3 is captured at CP14.

Once the scan path contents diagram has been completed using the above-described procedure, both the stimulus bit stream required to be output from the tester and the response bit stream expected to be received at the tester are easily determined by inspection of the completed diagram. In particular, the stimulus bit stream required from the tester is shown in the SI column of the completed diagram, and the response bit stream expected to be received at the tester is shown in the SO column of the completed diagram.

The scan path contents diagram for any desired set of circuits under test can actually be completed manually using pencil and paper and following the above-described procedure. Of course, a computer program can be readily written to complete the diagram in automated fashion.

In Example 2, the response from C1 reduced the need of stimulus in C2 and C3. Also, the bypass concept works to allow circuits downstream of circuits already tested to receive stimulus data from the tester through a pipelined data path that maintains the stimulus data from the tester during capture operations. While the invention can work by shifting data through the scan paths of circuits previously tested, instead of using the bypass memory, the scan path length between the tester and downstream circuits being tested grows in length since following each capture operation, the tester must shift data through all leading tested circuits to input data to circuits being tested. Further, the use of the bypass feature allows the scan paths of circuits tested to be held static while testing is progressing in downstream circuits. Holding scan paths static eliminates power consumption within tested circuits, except for the bypass scan path, and thereby eliminates heat build up in circuits previously tested. Eliminating heat build up in circuits is important, especially at wafer level testing using the warping scan test concept as will be described in regard to FIGS. 26-29.

A Further advantage to the bypassing feature is that it allows the tester to directly, via intermediate bypass memories, apply all remaining stimulus patterns to the circuit being tested downstream. If the scan paths of previously tested circuits were to remain in the scan path between the tester and circuit being tested, there is the possibility that the circuit being tested may not be able to receive all of its remaining stimulus patterns. This is because the scan paths between the tester and circuit being tested may not be able to produce the required stimulus patterns by the capture and shift process. Simply put, the intermediate scan paths between the tester and circuit being tested may not have a response pattern to any stimulus pattern applied that will produce the required remaining stimulus pattern(s) for the circuit being tested.

Figure 1:
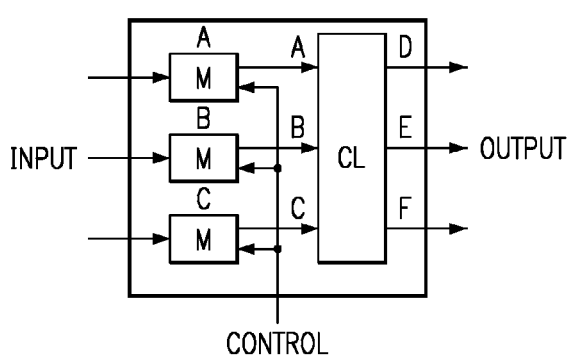
FIGS. 1-6 illustrate conventional approaches to scan testing.
Figure 2:
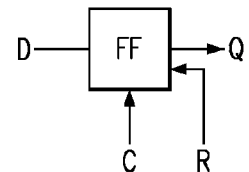
Figure 3:
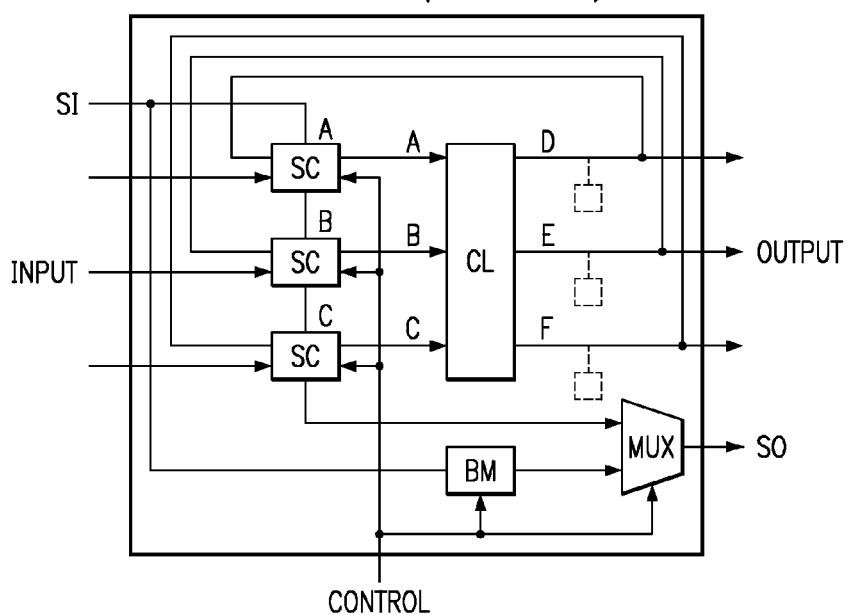
Figure 9:
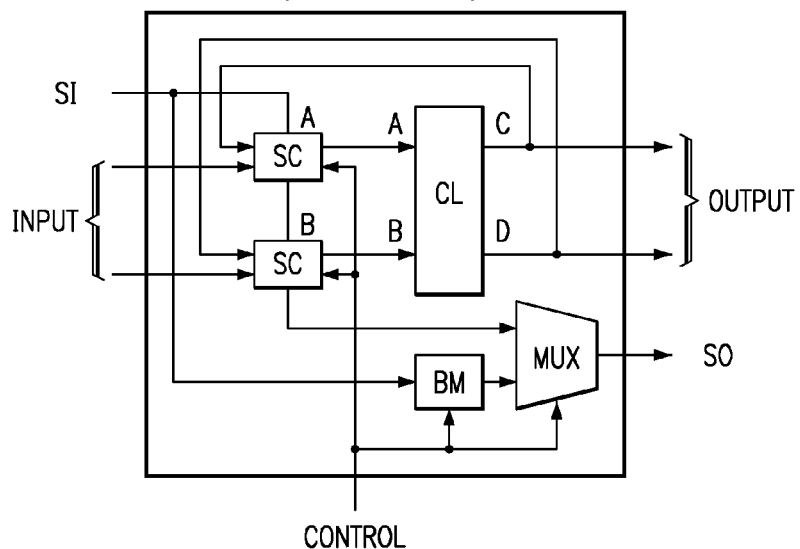
FIGS. 9-11 illustrate conventional scan path structures.

FIG. 9 shows a circuit similar to the FIG. 3 circuit except that it only has a 2-bit scan path. The circuit of FIG. 9 will be used in Examples 3 and 4 to illustrate the operation of the present invention with circuits having unequal scan path lengths.

Figure 5:
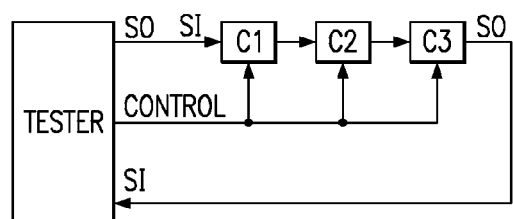

Example 3 illustrates three circuits C1, C2, and C3, again connected to a tester as shown in FIG. 5. C1 has a 2-bit scan path, C2 has a 3-bit scan path, and C3 has a 2-bit scan path. The tables for C1, C2, and C3 show the stimulus and response reaction of each circuit's combinational logic during scan testing. At the beginning of the test, the tester outputs control to reset all circuit scan paths to a first initial present state as previously described in Example 2. Then the tester does four capture and 2-bit shift operations (CP1-4 & SH1-4) to test C1 as previously described in Example 2. At the end of SH4, C2 has been tested against 4 of its 8 3-bit stimulus patterns (000,010,100,111), and C3 has been tested against 3 of its 4 2-bit stimulus patterns (00,01,11).

After the fourth shift operation (SH4), C1 is completely tested and is bypassed as previously described in Example 2. Also after SH4, the tester adjusts from 2-bit shift operations to 3-bit shift operations to test C2 since it has a 3-bit scan path. To complete the testing of C2, the tester does four capture and 3-bit shift operations (CP5-8 & SH5-8). CP5 and SH5 test C2 and C3 against previously tested 000 and 00 stimulus pattern, respectively, left in C2's and C3's scan path at the end of SH4. SH5 also loads into C2's 3-bit scan path the first of the remaining four C2 stimulus patterns (001), whose response is captured at CP6. CP7-9 and SH6-9 test C2 against the remaining three C2 stimulus patterns (011,101,110). During CP8 and SH8, C3 is tested against its remaining 2-bit stimulus pattern (10) by output response from C2 during CP7 and SH7, so C3 is completely tested by the testing of C1 and C2. CP9 loads the last response from C2 to its last remaining stimulus pattern (110). Since C3 has been tested, the tester does not need to bypass C2. Subsequently, during SH9, the tester adjusts the scan operation to a length of 5 bits so that the final response from C2 can be shifted out during the SH9 operation. It is important to note here that the 2-bit contents of C3's scan path is important during the SH9 operation, since it contains the response residue of C2 to the 101 stimulus pattern captured and shifted out of C2 during the CP8 and SH8 operations.

During the first four capture and 2-bit shift operations, the 3-bit scan path of C2 is only partially filled from C1 (2-bits) and only partially emptied to C3 (2-bits). This means that one bit of C2's 3-bit response pattern from a previous capture and shift operation will remain in C2's scan path and be reused itself as part of the stimulus pattern for the next capture and shift operation of C2. The other two bits used for C2's next 3-bit stimulus pattern will be provided by the shifted in 2-bit response output from C1.

In general, a leading circuit with a shorter scan path will amplify the number of stimulus patterns input to a following circuit with a longer scan path. This is because the frequency of capture and shift operations to both circuits is determined by the time it takes to shift data in and out of the leading shorter scan path. For example, at the beginning of the Example 3 test, the frequency of the capture and shift operations to all circuits is set by the first four (SH1-4) 2-bit shift operations that load stimulus patterns from the tester into C1. This same capture and shift frequency for the first four 2-bit shift operations is used to load stimulus patterns from C1 into C2, and from C2 into C3. So, C2 actually receives its first four stimulus patterns, which would take four 3-bit shift operations using conventional scan testing, in only four 2-bit shift operations using the warping scan test concept. For the first four shift operations, the input stimulus pattern to C2 comprises two bits of response from C1 plus one bit of retained response from C2. This is seen for example in the creation of C2's third present state (PS3) stimulus pattern 100. PS3 100 is created by CP2 loading the scan paths of C1 and C2 with 10 and 011, respectively, then shifting the scan paths twice during SH2 to obtain 100 in C2's scan path.

The number of test clocks required to test circuits C1, C2, and C3 using the warping scan test concept shown in Example 3 is 34. Testing the circuits of Example 3 using conventional scan testing, as described in Example 1, would require 64 test clocks.

Example 4 illustrates three circuits C1, C2, and C3, again connected to a tester as shown in FIG. 5. C1 has a 3-bit scan path, and C2 and C3 both have 2-bit scan paths. The tables for C1, C2, and C3 show the stimulus and response reaction of each circuit's combinational logic during scan testing. At the beginning of the test, the tester outputs control to reset all circuit scan paths to a first initial present state as previously described in Example 2. Then the tester does seven capture and 3-bit shift operations (CP1-7 & SH1-78) and one capture and 7-bit shift operation (CP8 & SH8) to test C1 as previously described in Example 2. During the testing of C1, C2 and C3 receive all their required stimulus patterns by response output from C1. So when C1 is tested, so are C2 and C3. Since C2 and C3 are tested during C1's tests, no bypassing steps are required. Following CP8, a seven bit shift operation is performed during SH8 to allow the tester to unload all response residue from the scan paths of C1, C2, and C3 to complete the test.

The number of test clocks required to test circuits C1, C2, and C3 using the warping scan test concept shown in Example 4 is 36, as opposed to 64 test clocks using conventional scan testing as described in Example 1.

Figure 10:
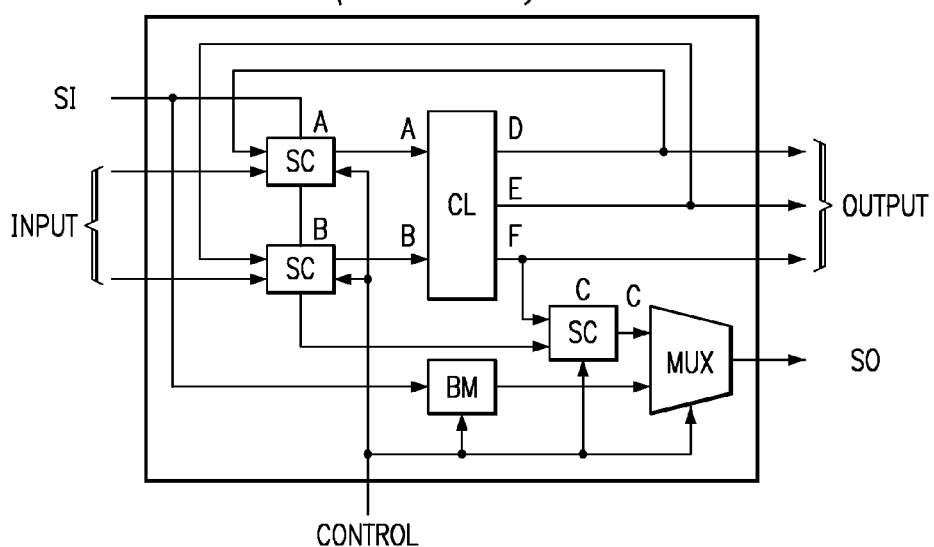

FIG. 10 shows a circuit similar to the previously described FIG. 3 circuit, except that it has an greater number of outputs (3) than inputs (2). Since the number of outputs is greater than the number of inputs, a scan cell is added to the extra output so that its response can be captured and shifted out during scan testing. The structure of the scan cell (C) added and connected to the F output of the combinational logic is prior art and shown in FIG. 11. During conventional scan testing, scan cell C serves to capture the F output and shift the data out. It is important to note that in conventional scan testing of the FIG. 10 circuit, the data shifted into the scan cell (C) is don't care data since the data does not provide stimulus input to the combinational logic.

Figure 12:
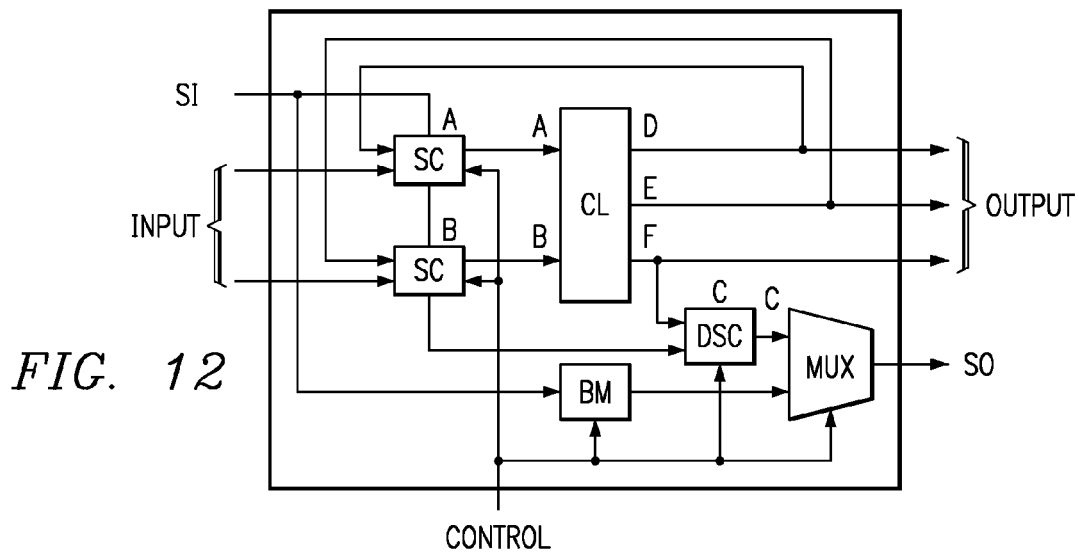
FIGS. 12 and 13 illustrate the structure and use of a data summing scan cell according to the present invention.
Figure 13:
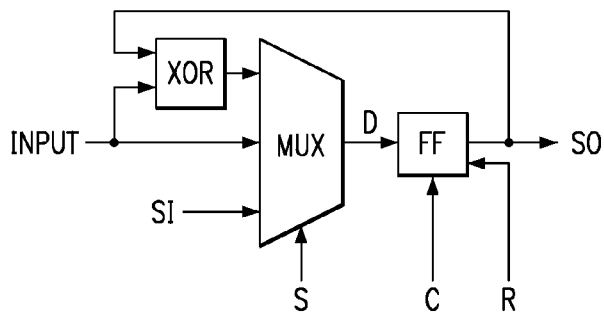

FIG. 12 shows how the FIG. 10 circuit is modified to support the warping scan test concept. The modification is to replace the prior art scan cell (C) connected to F with a data summing cell (DSC) as shown in FIG. 13. The warping scan test concept requires that scan cells that are added solely for the purpose of capturing response data, as shown in scan cell C of FIG. 12, be loaded during capture operations with the sum of their present state data and the data they are capturing. This way, response data shifted into the scan cell is not lost during the capture operation.

In FIG. 13, the data summing cell includes a 3 input multiplexer, an XOR gate, and a FF. The multiplexer is controlled by a select signal (S) to allow either the output of the XOR, the normal capture input (Input), or the serial input (SI) to be coupled to the FF. During conventional scan testing, the multiplexer couples the Input to the FF during capture operations, and the SI to the FF during shift operations, just like the FIG. 11 scan cell. During warping scan tests, the multiplexer couples the XOR output to the FF during capture, instead of the conventional Input. The output of the XOR represents the sum of the Input data and the present state data of the FF. The reason for summing the Input data with the FF's present state data is that the FF will potentially contain response data shifted in from a previous circuit, which is not used in FIG. 12 as stimulus. The response data bit in the FF cannot be lost by the capture operation, as is done in the conventional scan cell of FIG. 11. If the response data were lost (overwritten) by the capture operation, that response data bit or its effect as stimulus to downstream circuits would not be seen by the tester. So, to allow the response data in the FF to be maintained during the capture operation, it is summed with the Input data, and that sum data is stored into the FF during capture.

Since the FF data is not lost, it meets the requirement mentioned above for the warping scan test concept.

Example 5 shows two circuits C1 and C2 being tested using the warping scan test concept. C1 is a circuit as shown in FIG. 3 with a 3-bit scan path. C2 is a circuit as shown in FIG. 12 with a data summing cell (DSC) coupled to the F output of the combinational logic. The present state and next state table of C1 is shown as previously described. The present state and next state table for C2 indicates the summing of the F output of the combinational logic and the present state of scan cell C (the DSC). In looking at FIG. 12 it is seen that the combinational logic only responds to stimulus from scan cells A and B. In looking at the C2 table, it is seen that; (1) for a PS ABC of 00x, the DEF outputs are 010, (2) for a PS ABC of 10x, the DEF outputs are 100, (3) for a PS ABC of 10x, the DEF outputs are 110, and (4) for a PS ABC of 11x, the DEF outputs are 000. Again looking at the C2 table it is seen that; when F=0 and the PS C=0, the NS C=0, and when F=0 and the PS C=1, the NS C=1. This shows the XOR'ing of output F with PS data in scan cell C.

The warping scan test of C1 and C2 in Example 5 proceeds as previously described. What is important about Example 5 is to see that the response data from C1 shifted into scan cell C of C2 is not lost during the capture operations. During each capture operation the response data from C1 in scan cell C is summed with the response output F from C2's combinational logic and that summed signal is shifted out to the tester for inspection. This way if C1 or C2 had a faulty response bit, it would be detectable by the tester. It is possible for a double fault to occur in C1 and in C2 such that the sum of the two faults appear to be a correct response. For example if a good response of 1 from C1 were summed with a good response of 0 from C2, the result would be an output to the tester of a 1. If a bad response of 0 from C1 occurred coincidental with a bad response of 1 from C2, the result would also be an output to the tester of a 1. This is called aliasing and it is known to those skilled in the art of testing, especially testing using signature analysis methods. The likelihood of aliasing is rare, but it can happen.

Figure 14:
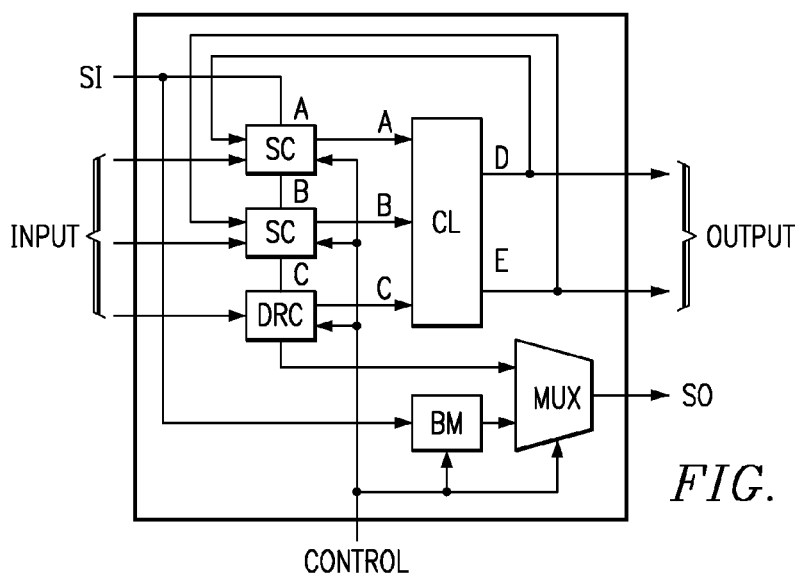
FIG. 14 illustrates a scan path structure according to the present invention.

FIG. 14 shows a scan testable circuit with 3 inputs and 2 outputs. Outputs D and E are fed back to scan cells A and B, respectively. Scan cells A and B provide stimulus to the circuit's combinational logic and capture response from the combinational logic. Scan cell C only provides stimulus to the circuit's combinational logic. It is advantageous for scan cell C to retain the data shifted into it during capture operations. If the data is retained, it can be output to the tester or reused as stimulus data in downstream circuits. If the scan cell of FIG. 11 were used as scan cell C in FIG. 14, it would capture data from the circuit's input, which may be unknown data. A preferred scan cell called a data retaining cell (DRC) is shown in FIG. 14 and shown schematically in FIG. 15. The data retaining cell simply captures the present data state of the FF during capture operations, which allows the data to be supplied to the tester or reused as stimulus data in downstream circuits.

Figure 15:
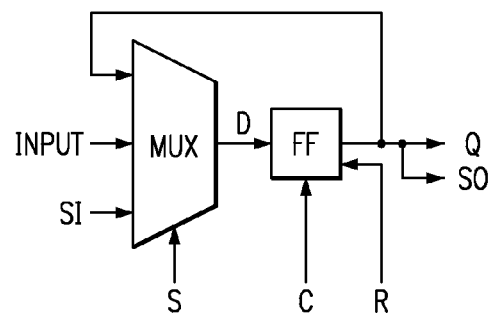
FIG. 15 illustrates in more detail the conventional data retaining scan cell of FIG. 14.

Example 6 simply shows a circuit C1 like FIG. 3 and a circuit C2 like FIG. 14 having a data retaining scan cell C as shown in FIG. 15. The circuits are tested using the warping scan test concept as previously described. What is important to see in Example 6 is that the C1 response data shifted into scan cell C of C2 is retained during the capture operation to be shifted out to the tester. By retaining the data in scan cell C, the tester has the ability to better diagnose failures. For example if a failing response was output from C2, that failure may be caused by either; (1) bad combinational logic of C2, (2) incorrect stimulus input from C1 to scan cell C of C2, or (3) both a bad combinational logic in C2 and a bad input stimulus from C1 to scan cell C of C2. If the data in scan cell C is retained, then the tester can diagnose this situation to determine what was bad.

Example 7 shows the ideal case for the warping scan test concept. In Example 7, N circuits as shown in FIG. 3 are connected in series on a scan path operated from a tester as shown in FIG. 5. Every leading circuit in this ideal case produces response output that meets the stimulus input need of a trailing circuit. In this example, all circuits are identical as seen in the present state and next state table. However, they need not be identical, but rather, for the ideal case, they need to meet the statement above, which restated says that "a leading circuit must produce output response that meets the stimulus need of a trailing circuit". A leading circuit may produce more output response than is needed for stimulus in a trailing circuit and still meet the above criterion, but it cannot produce less. Also, leading and trailing circuits may have scan path length differences and still meet the above statement.

In Example 7 it is seen that by the time the first C1 is tested, all trailing C1s have been tested. The last shift operation (SH8) is used to unload all C1 scan path response residue to the tester. This is a remarkable reduction in test time, especially for IC and system manufacturers, since N circuits could be tested in the time it take to test one circuit, plus the time it takes to shift out the response residue from the N circuits. The N circuits could be die, wafers, ICs, boards, etc. Examples of different ways the warping scan test concept could be employed to reduce test time is described later in regard to FIGS. 22-29.

While Example 7 shows the circuits as having 3-bit scan path length and a stimulus pattern requirement of eight, the circuits could have any scan path length or any stimulus pattern count. If the circuits are identical, and their scan path lengths are L, their stimulus pattern count is P, and the capture step is C, an equation for the number of test clocks required to test N identical circuits using the warping scan concept is $P(C+L)+NL-L$, where $P(C+L)$ is the test clocks required to test the first circuit (and the other N−1 circuits), and $NL-L$ is the test clocks required to unload the scan paths of the remaining N−1 circuits. In comparison, an equation for the number of test clocks required to test N identical circuits using the conventional scan approach is $P(C+NL)$. For large L and P, the equations simplify to: Warping Scan Test Clocks=L(P+(N−1)) and Conventional Scan Test Clocks=LPN.

Case 1: For L=2000, P=1000, N=1
Warping Scan Test Clocks=L(P+(N−1))=2000(1000+(1−1))=2,000,000
Conventional Scan Test Clocks=LPN=2000×1000×1=2,000,000

Case 2: For L=2000, P=1000, N=100
Warping Scan Test Clocks=L(P+(N−1))=2000(1000+(100−1))=2,198,000
Conventional Scan Test Clocks=LPN=2000×1000×100=200,000,000

Case 3: For L=2000, P=1000, N=1000
Warping Scan Test Clocks=L(P+(N−1))=2000(1000+(1000−1))=3,998,000
Conventional Scan Test Clocks=LPN=2000×1000×1000=2,000,000,000

For a test clock frequency of 10 megahertz (period=100 nanoseconds), Case 1 warping scan test time and conventional scan test is 200 milliseconds. Case 2 warping scan test time is 219.8 milliseconds, and conventional scan test time is 20 seconds. Case 3 warping scan test time is 399.8 milliseconds, and conventional scan test time is 200 seconds.

For non-ideal circuits 1-N where the response output from a tested leading circuit only reduces the stimulus need of all trailing circuits by a % reduction factor (R), the test clocks required by the warping scan test concept can be approximated by;

Test Clocks=$P_1(C+L_1)+RP_2(C+L_2)+RP_3(C+L_3) \ldots RP_N(C+L_N)$

For large $P_{1-N}$ and $L_{1-N}$, the equation simplifies to;
Test Clocks=$P_1L_1+RP_2L_2+RP_3L_3 \ldots RP_NL_N$ If the % reduction factor (R) is constant for each circuit, for example at the end of each leading circuit test, the need for additional stimulus in all trailing circuits is reduced by an R of 50%, then;

Test clocks=$P_1L_1+\frac{1}{2}(P_2L_2)+\frac{1}{4}(P_3L_{3_)})+\frac{1}{8}(P_3L_{3_)}) \ldots \frac{1}{2}^N(P_NL_N)$ If all circuits have the same P and L, then;
Test Clocks=$P_{1-N}L_{1-N}(1+\frac{1}{2}+\frac{1}{4}+\frac{1}{8}+ \ldots \frac{1}{2}^{N-1})$ Case 4: For L=2000, P=1000, N=2
Warping Scan Test Clocks=PL(1+½)=3,000,000
Conventional Scan Test Clocks=PL(2)=4,000,000

Case 5: For L=2000, P=1000, N=5
Warping Scan Test Clocks=PL(1+½+¼+⅛+1/16)=3,875,000
Conventional Scan Test Clocks=LP(5)=2000×1000×5=10,000,000

Case 6: For L=2000, P=1000, N=100
Warping Scan Test Clocks=PL(1+½+¼+⅛+ . . . ½$^{100-1}$)=<4,000,000
Conventional Scan Test Clocks=LP(5)=2000×1000×100=200,000,000

Case 7: For L=2000, P=1000, N=1000
Warping Scan Test Clocks=PL(1+½+¼+⅛+ . . . ½$^{1000-1}$)=<4,000,000
Conventional Scan Test Clocks=LP(5)=2000×1000×1000=2,000,000,000

In comparing Case 2 with Case 6 (N=100) and Case 3 with Case 7 (N=1000), it is seen that there is little difference in the number of test clocks between the ideal and non-ideal warping scan test cases, as long as the % reduction factor R is maintained at 50% in the non-ideal cases.

Figure 32:
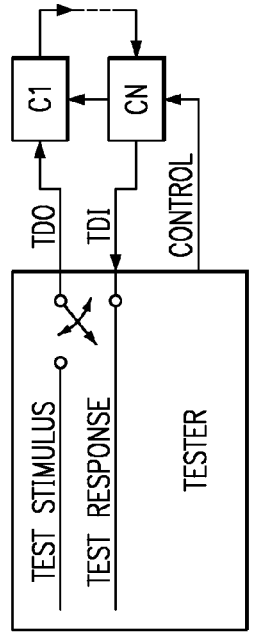
FIG. 32 illustrates the present invention's ability to perform closed loop scan testing.

Referencing FIG. 32, if a selectively switchable connection is provided as shown between the tester's TDI and TDO, then all N circuits of Example 7 can be completely tested by executing the same 8 capture (CP1-CP8) and shift (SH1-SH8) operations shown in Example 7. However, using the closed loop scan path arrangement of FIG. 32, the tester need only provide control to the scan path and need not provide any test stimulus data to the scan path. The response data received at the tester's TDI input is fed through the switch and into circuit C1 as stimulus.

Example 7 has shown that many identical circuits can be tested quickly using warping scan. Also it has been shown that identical circuits can be tested by tester supplied stimulus (FIG. 22), or by providing a closed-loop scan path (FIG. 32) such that no tester stimulus is required.

Example 8 illustrates a test similar to that in Example 7. In Example 8, the next state of present state 010 is xxx (not defined), and the next state of present state 101 is xxx. In Example 7, all next states of the combinational logic were functionally required and defined as shown in the C1 table of Example 7. In Example 8, the 010 and 101 present states are not functionally required and are therefore not defined, thus unknown next states (xxx's) are listed in the C1 table for the 010 and 101 present states.

In conventional scan testing, unknown next states are tolerable since the entire scan path response pattern is shifted out during each scan cycle. However, using warping scan, unknown states in the response pattern are not acceptable since they would propagate unknown response to circuits to be used as stimulus. Two example solutions to the unknown next state problem of Example 8 are given below.

One solution is to comprehend that the functional truth table of the circuit in Example 8 contains undefined next states for the 010 and 101 present states. Once this is understood, the test will commence as in Example 7 and progress up to the first present state that produces an unknown next state, i.e. up to 010 at PS2. When the 010 present state is reached, the tester will empty out the unknown states from the scan path and fill the scan path of each circuit with a next present state (011) that will allow the warping scan test to continue. When the 101 present state at PS6 is reached, the tester will once again empty out the unknown states from the scan path and fill the scan path of each circuit with a next present state (110) that will allow the warping scan test to continue. After this second empty and fill scan operation, all unknown next states have been accounted for and the warping scan test can run to completion as previously described in Example 7. The tester must therefore interrupt the warping scan operation twice during the test to unload unknown response data from the scan path and to load known stimulus data into the scan path. If the tester forms a closed loop scan path as shown in FIG. 32, the loop must be opened during these two interruptions so that the tester can input the known stimulus into the scan path. The tester can ignore the unknown response from the scan path during the two interruptions.

Another example solution is to intentionally extend the truth table to comprehend that the circuits need to be designed for warping scan testing (i.e. warpability). This means that while the circuits have no functional requirement for defining the next states of present states 010 and 101, there is a test requirement for defining these next states. This test requirement is to make the circuit provide known response output which will facilitate the most effective warping scan test times that can be achieved. In Example 8 the most effective next state response definitions for the 010 and 101 present states are the response previously shown for these present states in the truth table of Example 7. Once the circuits of Example 8 have been redesigned for warpability by defining the next states for present states 010 and 101 to match the truth table in Example 7, the same warping scan test previously used to test the circuits of Example 7 can be repeated on the circuits of Example 8, including tester supplied stimulus method and closed loop method. This description illustrates a fundamental design concept for circuits that are to be tested using warping scan. That fundamental design concept is to identify all inputs (present states) to a circuit that do not produce functionally defined outputs (next states) from the circuit and, after identifying these inputs, design the circuit to respond to these inputs by producing outputs that can be used to satisfy a test stimulus input need to another circuit.

Example 9 shows another problem that can be encountered during warping scan testing. In Example 7, all next state responses produced a required stimulus input for the circuits. In Example 9, the next state response of present state 001 is 001. This causes the circuits being tested to lock-up on the 001 state and prevents further testing using warping scan. The two example solutions described below can be used to unlock the circuits and allow the warping scan test to continue to completion.

One solution to escape lock-up is to completely empty the lock-up states (001 in Example 9) from the scan path and then fill the scan path of each circuit with a next state (010) that will allow the warping scan test to continue. This emptying and filling of the scan path is the same as previously described relative to Example 8, except the lock-up states that are emptied from the scan path are actually test responses in Example 9.

Another example solution to escape lock-up is to alter, or modulate, the warping scan cycle length to re-position the scan path data at different scan cell locations in the scan path. In Example 9, the SH2 cycle is shown doing only a two bit shift instead of the normal three bit shift. The two bit shift operation moves only two bits (01) of the lock-up pattern from a leading circuit to a trailing circuit, to Following the two bit shift operation, each circuit's scan path contains a stimulus pattern (010) that will allow the warping scan test to continue to completion. This solution solves the lock-up problem without having to completely empty and fill the scan path. This solution does not require stimulus input from the tester and may therefore be used when the closed loop mode of FIG. 32 is used.

In each of Examples 8 and 9, the tester is preferably programmed to track the scan path contents diagram, which diagram is developed in the manner described above. The tester will therefore know when the lock-up condition occurs so that the desired lock-up solution can be timely implemented.

Figure 16:
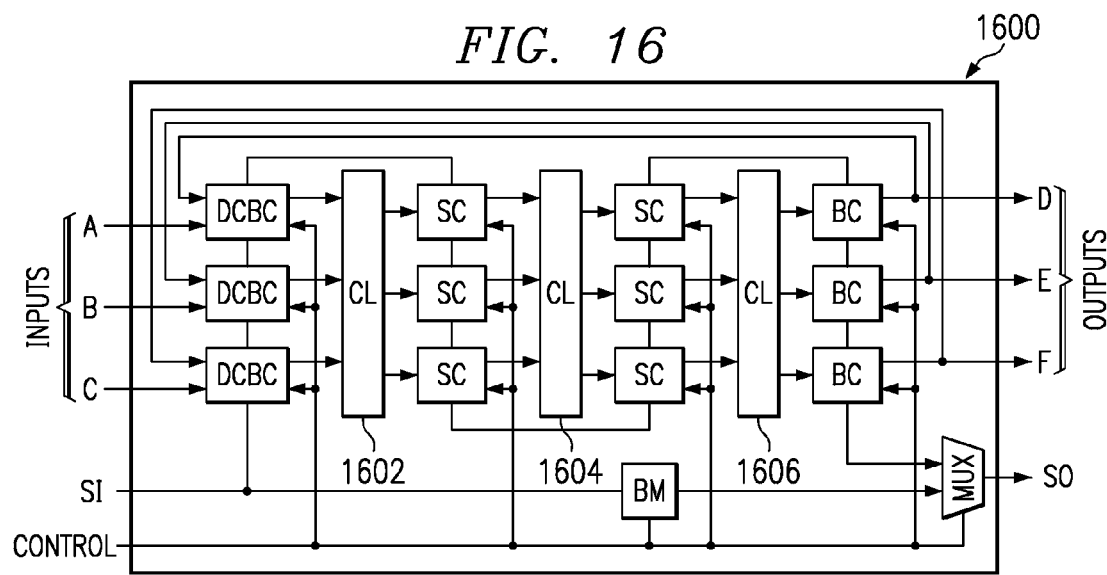
FIG. 16 illustrates a boundary scan cell having its data output connected to a capture input of another boundary scan cell according to the present invention.
Figure 17:
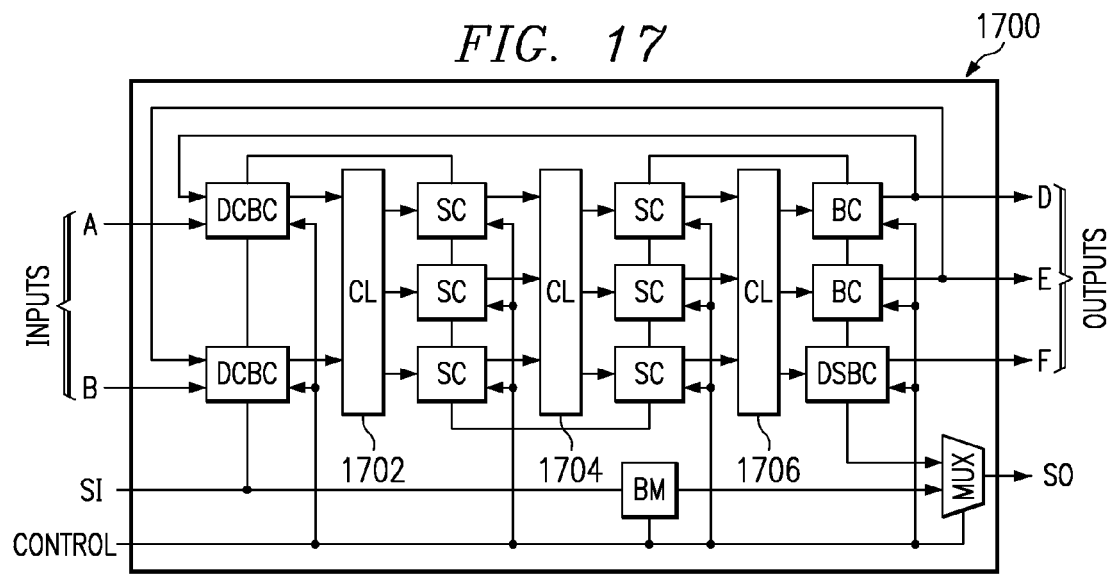
FIG. 17 illustrates the use of a data summing boundary scan cell according to the present invention.
Figure 18:
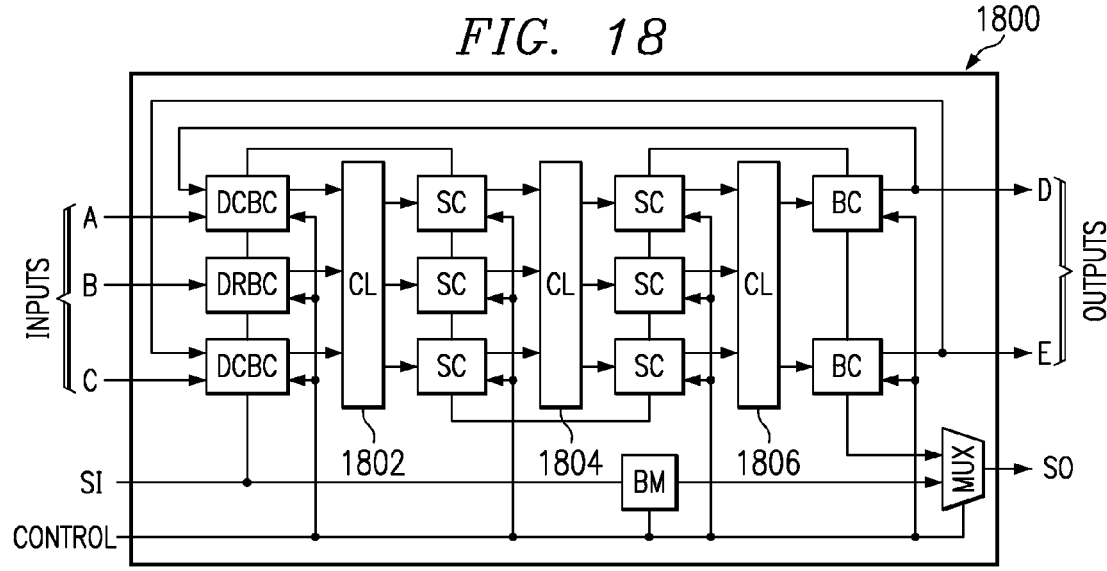
FIG. 18 illustrates the use of a data retaining boundary scan cell according to the present invention.

FIGS. 16 through 18 illustrate an example of how the warping scan test concept could be implemented on circuits that have scannable boundary cells (BC) at the primary inputs and outputs (boundary) of the circuits. Boundary scan cells are well known in the art of testing. FIG. 16 relates to the previously described FIG. 3. FIG. 17 relates to the previously described FIG. 12. FIG. 18 relates to the previously described FIG. 14.

The data capture boundary cells (DCBC) of FIGS. 16, 17, and 18 relate to the previously described data capture cell of FIGS. 3 and 4A. The data summing boundary cell (DSBC) of FIG. 17 relates to the previously described data summing cell DSC of FIGS. 14 and 15. The data retaining boundary cell (DRBC) of FIG. 18 relates to the previously described data retaining cell DRC of FIGS. 12 and 13.

Figure 19:
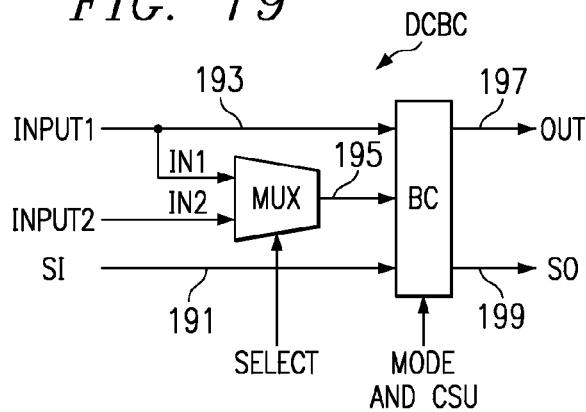
FIG. 19 illustrates the data capture boundary scan cell of FIGS. 16-18 in more detail.
Figure 20:
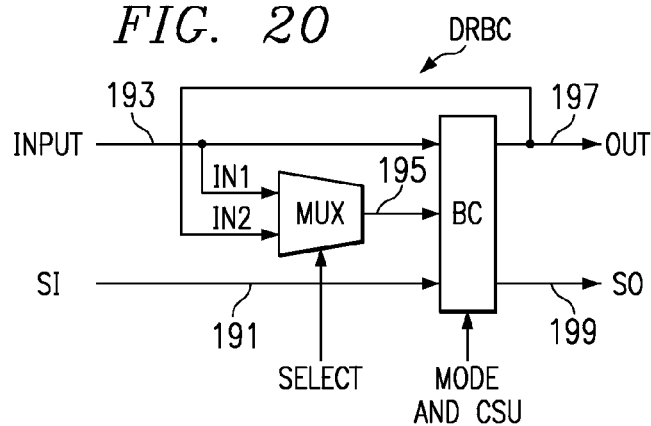
FIG. 20 illustrates the data retaining boundary scan cell of FIG. 18 in more detail.
Figure 21:
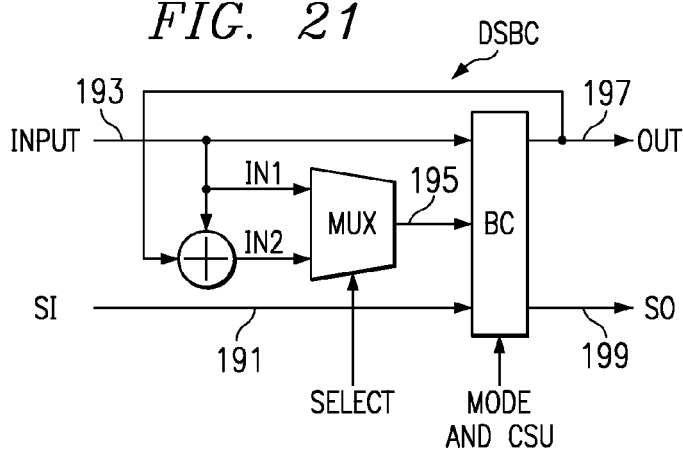
FIG. 21 illustrates the data summing boundary scan cell of FIG. 17 in more detail.
Figure 21A:
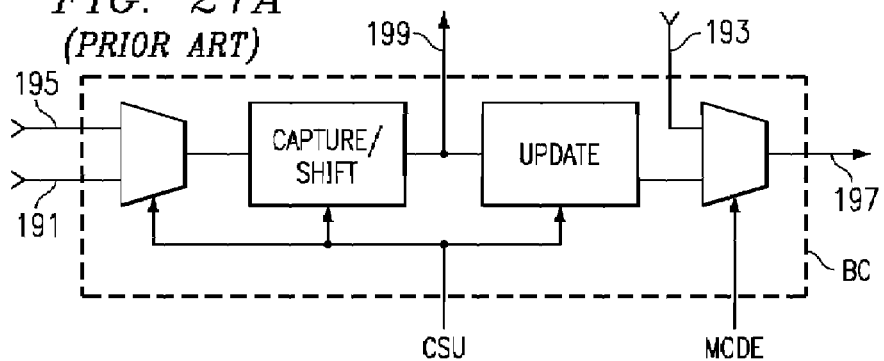
FIG. 21A illustrates in more detail a conventional boundary scan cell shown in FIGS. 16-21.

Example designs for DCBC and DRBC are respectively shown in FIGS. 19 and 20. An example design for DSBC is shown in FIG. 21. FIG. 21A shows how DCBC, DRBC and DSBC are realized. Nodes 191, 193, 195, 197 and 199 are connected as shown. The BC structure enclosed in broken line is conventional.

As indicated above, conventional integrated circuits, and cores (such as processors, memories) within integrated circuits, often include boundary scan cells associated with the inputs and outputs at the boundary of the integrated circuit or core. FIG. 16 illustrates how the invention accommodates boundary scan cells in a warping scan path.

Data shifted into the boundary scan cells BC of FIG. 16 will not provide test stimulus to CL. Nevertheless, the data shifted into the FIG. 16 BCs is response data from an upstream circuit in the warping scan path, and must therefore be retained in the warping scan path in order to achieve the desired warping scan operation. But when the BCs capture response data from CL, the data previously shifted into the BCs is overwritten by the capture operation. Note, however, that the boundary scan cells associated with the inputs of FIG. 16 do not capture response data from CL, and are thus available to capture the data previously shifted into the BCs. So the outputs of the BCs are respectively connected to the inputs of the DCBCs (Input2 of FIG. 19) to permit the DCBCs to capture and then shift out the data previously shifted into the BCs. Thus, the response data from the upstream circuit is retained in the warping scan path as desired.

It should be clear from the foregoing that circuitry to be tested is partitioned into individual target circuits corresponding to respective scan path sections in the warping scan path, such as target circuits C1, C2 and C3 of Example 3. Any desired or advantageous partitioning is available. For example, the warping scan path for a printed circuit board could be partitioned into four scan path sections corresponding to the following four target circuits: (1) an IC; (2) a group of ICs (3) an entire IC and part of another IC; and (4) part of an IC such as an embedded core. The circuitry under test and the target circuits into which it is partitioned can have any desired level of complexity (see FIGS. 22-29).

Figure 11:
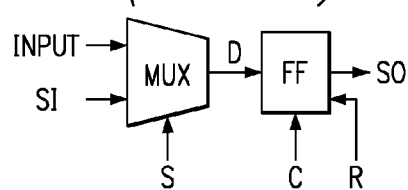

The scan cells SC of FIGS. 11 and 16 are capture-shift cells which are conventionally operated to capture data and thereafter shift data, and thereafter repeat the capture-shift sequence as shown in Examples 1-7. The boundary scan cells of FIGS. 16-21A are capture-shift-update cells which are conventionally operated to capture data and thereafter shift data and thereafter update data to the cell's output, and thereafter repeat the capture-shift-update sequence. However, the update memory of FIG. 21A can be conventionally embodied as a transparent-type (level sensitive) latch. It is conventional knowledge that this transparent latch can be controlled via CSU to be transparent and pass node 199 directly to the FIG. 21A output multiplexer. During the warping scan mode of operation, CSU control can be used to make the update memory transparent and thereby configure the capture-shift-update type boundary scan cells of FIGS. 16-21A as capture-shift type cells which will execute the same capture-shift sequence as SC of FIGS. 11 and 16 with the same effect. Thus, boundary scan cells such as BC (FIG. 21A) can be provided in the same scan path as internal scan cells such as SC (FIG. 11) and can operate identically to the internal scan cells with no change in the timing shown in Examples 1-7.

Even if the boundary scan cells of FIG. 16 are not configured as capture-shift cells, but rather maintained as capture-shift-update cells, the update control conventionally affects only the update memories, and would not affect the operation of the capture-shift memories in the boundary scan cells and the internal scan cells. Thus, the substance of Examples 1-7 would not be changed, but a conventional update operation would be inserted after each shift operation to permit the boundary scan cells to apply stimulus data to the target circuit. The next capture operation would then immediately follow the update operation. A similar situation arises if the conventional IEEE 1149.1 TAP controller is used to control the warping scan path. The TAP controller outputs control for capture-shift-update sequences. Thus, the TAP controller will also insert an update operation after each shift operation in Examples 1-7. Again, the update operation will not affect the operation of capture-shift memories in the scan path, but it will permit any capture-shift-update cells (e.g. boundary cells) to apply their test stimulus to the target circuit.

Figure 22:
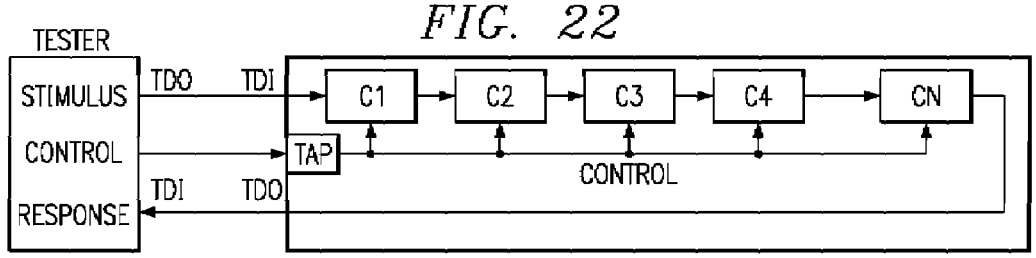
FIGS. 22-29 illustrate how a scan test methodology according to the present invention is used to test various levels of circuitry from die on wafer to systems.

FIG. 22 illustrates how the warping scan test concept could be used to test multiple circuits C1-CN inside an IC or Die. Each circuit 1-N in FIG. 22 could be similar to circuits previously described in regard to FIGS. 3, 12, 14, and 16-18. Also shown in FIG. 22 is the fact that the circuits may receive control during the warping scan test from a conventional IEEE 1149.1 standard Test Access Port (TAP) which is connected externally of the IC/Die to a tester. Alternately, the IC/Die could receive control directly from the tester, or via a test port different from the IEEE 1149.1 TAP.

Figure 23:
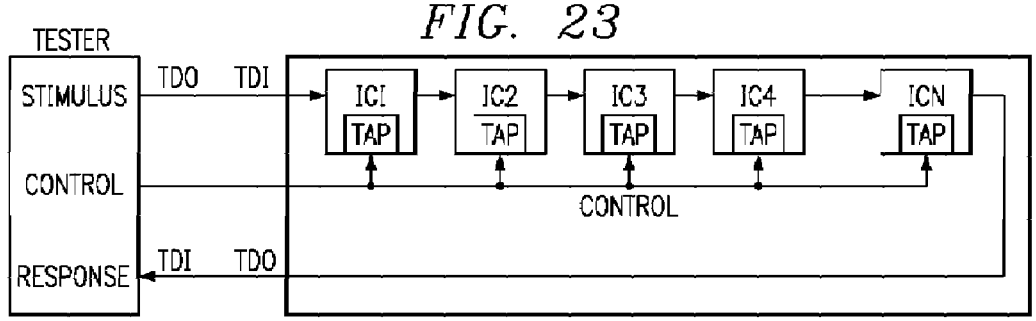

FIG. 23 illustrates how the warping scan test concept could be used to test multiple ICs 1-N on a board, or similarly, multiple Die 1-N on a multi-chip module (1CM) substrate. Each IC/Die 1-N in FIG. 23 could be similar to the IC/Die described previously in regard to FIG. 22. Each IC/Die of the board/MCM is shown interfaced to an external tester connected to the board/MCM.

Figure 24:
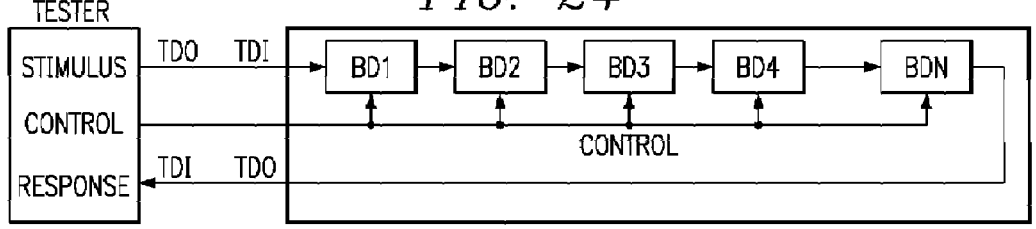

FIG. 24 illustrates how the warping scan test concept could be used to test multiple boards (BD) in a box. Each board 1-N in FIG. 24 could be similar to the board described previously in regard to FIG. 23. Each board of the box is shown interfaced to an external tester connected to the box/board.

Figure 25:
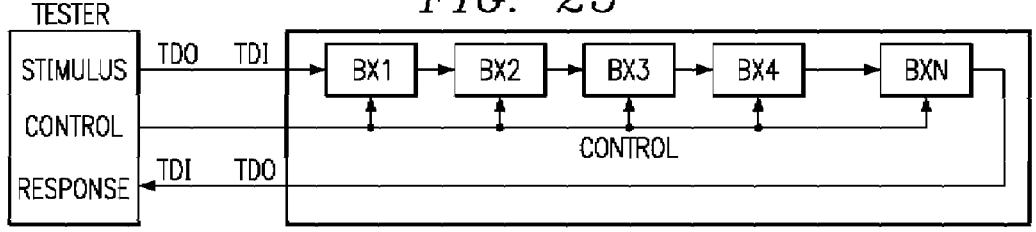

FIG. 25 illustrates how the warping scan test concept could be used to test multiple boxes (BX) 1-N in a system. Each box 1-N in FIG. 25 could be similar to the box described previously in regard to FIG. 24. Each box of the system is shown interfaced to an external tester connected to the system.

Figure 26:
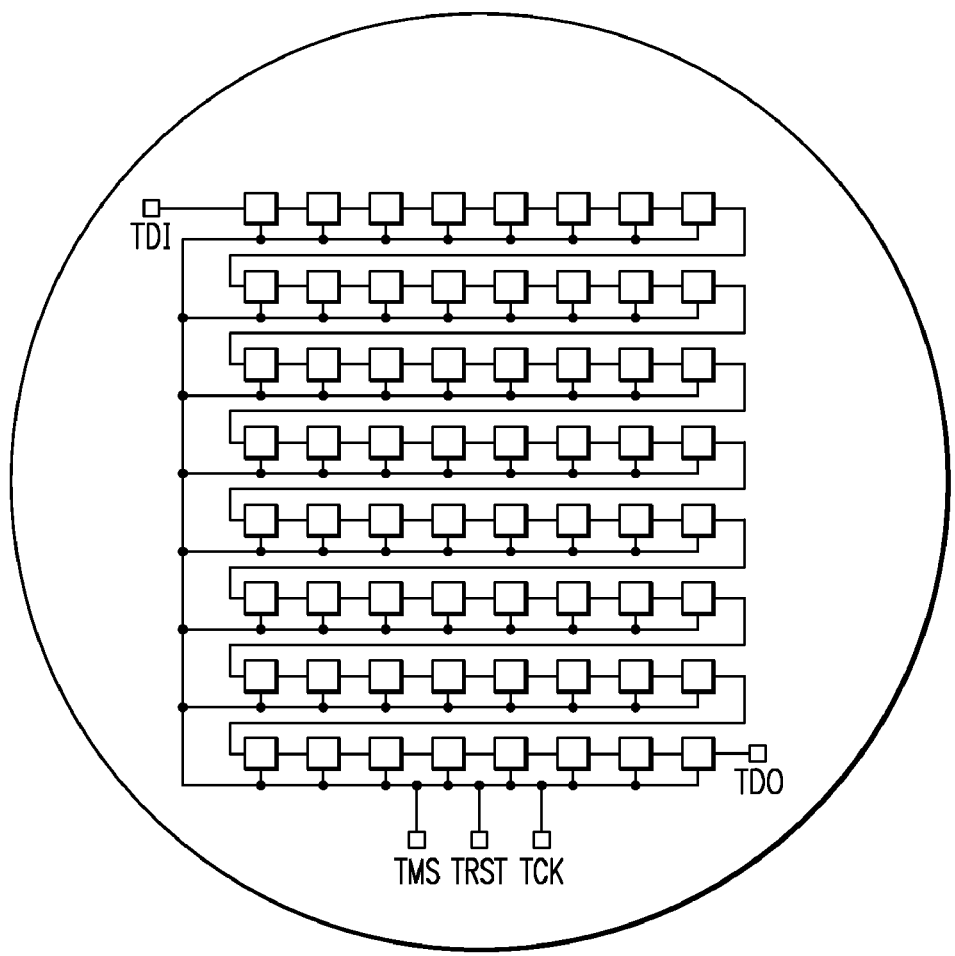
Figure 27:
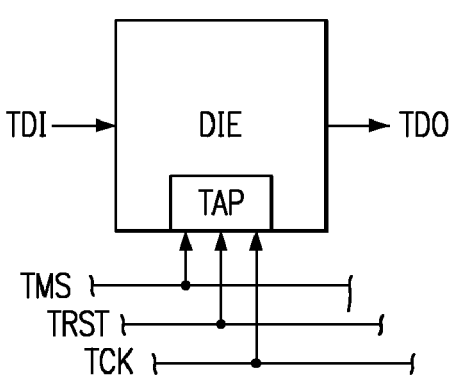

FIG. 26 illustrates how the warping scan test concept could be used to test die on a wafer. Each die could be similar to the die described previously in regard to FIG. 22. As seen in FIG. 27, each die on the wafer has an IEEE 1149.1 test data input (TDI), test data output (TDO), test clock (TCK), test mode select (TMS), and a test reset (TRST) pad connection. Also as shown in FIG. 26, all die are connected in series, via their TDI and TDO pads, between the wafer's TDI input and TDO output. Further, all die TMS, TCK, and TRST pads are connected in parallel to the wafer's TMS, TCK, and TRST inputs. By applying power to the wafer and executing the warping scan tests on all die by probing the wafer's TDI, TDO, TCK, TMS, and TRST wafer test points with a tester, extremely fast testing of all die on the wafer can be achieved. Also, since the warping scan test bypasses tested circuits and holds their scan paths static, very little heat is generated on the wafer during warp testing. For example, at the beginning of a warp scan test, the scan path of all die are active and start to generate heat. When the first die is tested it freezes its scan path and begins to cool. Similarly other circuits will freeze their scan paths and begin to cool after they have been tested. Also the speed of the warp scan test will prevent the circuits from being active for a long enough time to generate damaging heat.

Figure 28:
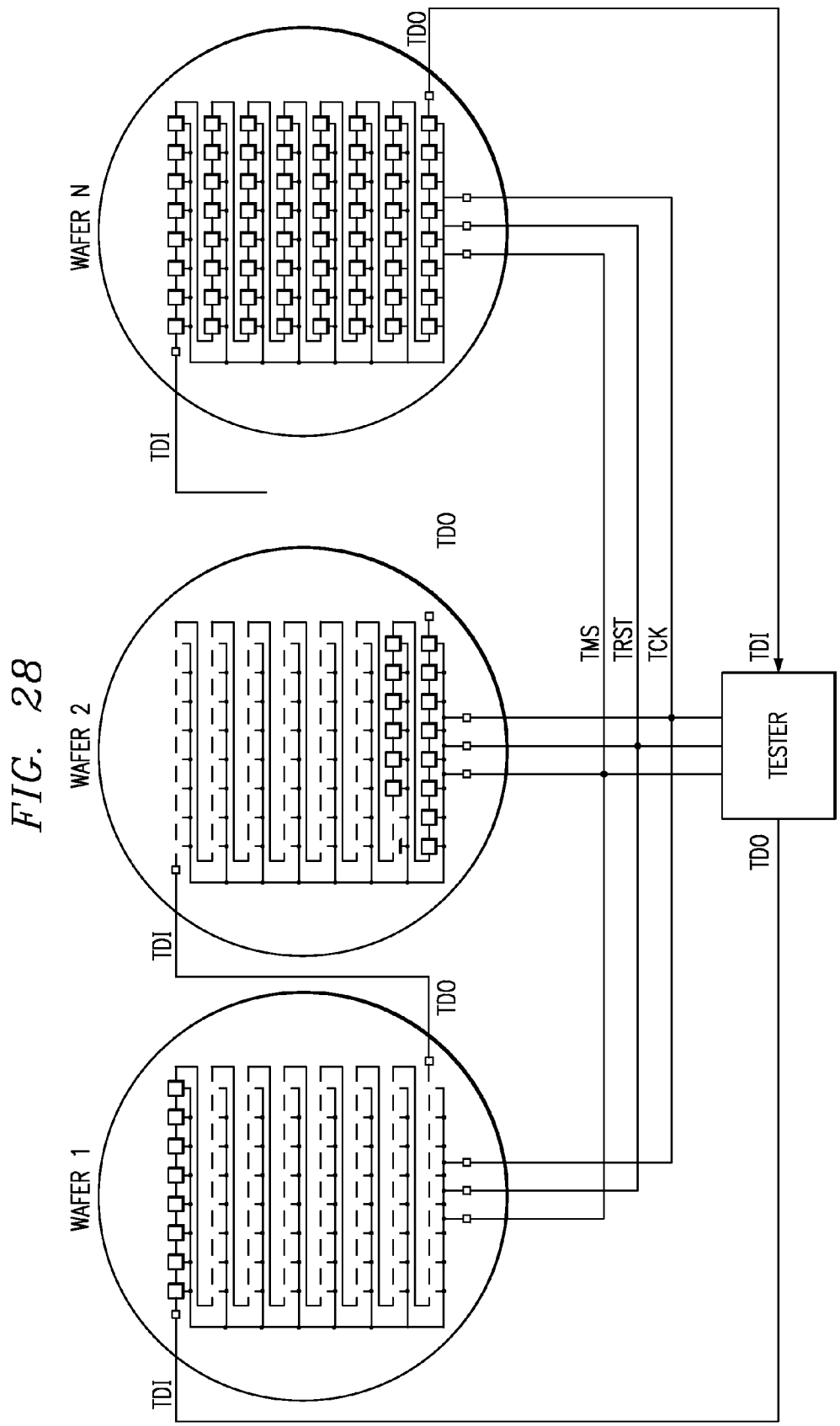

FIG. 28 illustrates how the warping scan test concept could be used to test multiple wafers in a lot. Each wafer 1-N in FIG. 28 could be similar to the wafer described previously in regard to FIGS. 26 and 27. Each wafer in the lot is shown interfaced to an external tester.

Figure 29:
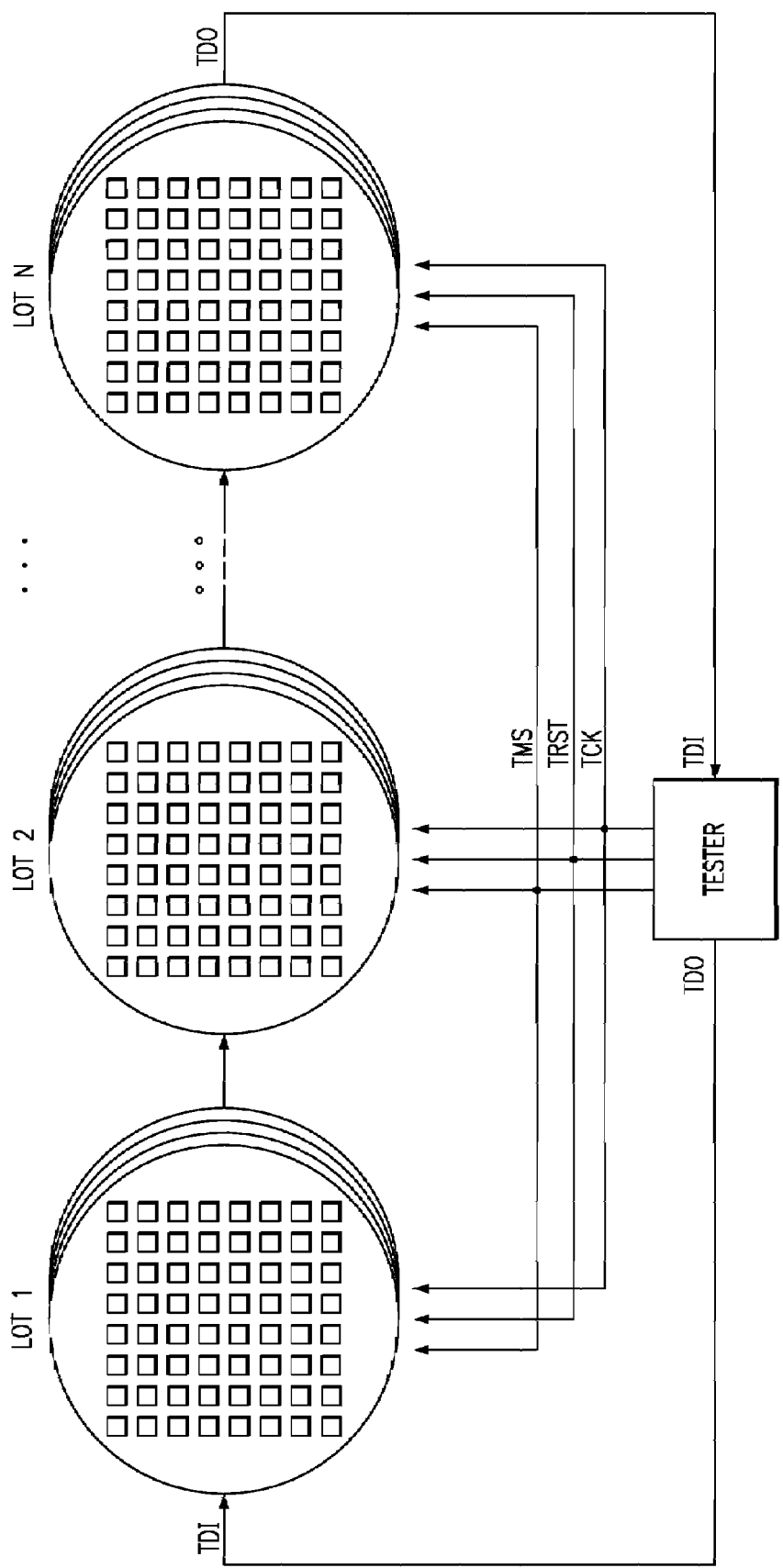

FIG. 29 illustrates how the warping scan test concept could be used to test multiple lots 1-N. Each lot 1-N in FIG. 29 could be similar to the lot described previously in regard to FIG. 28. Each lot is shown interfaced to an external tester.

Figure 30:
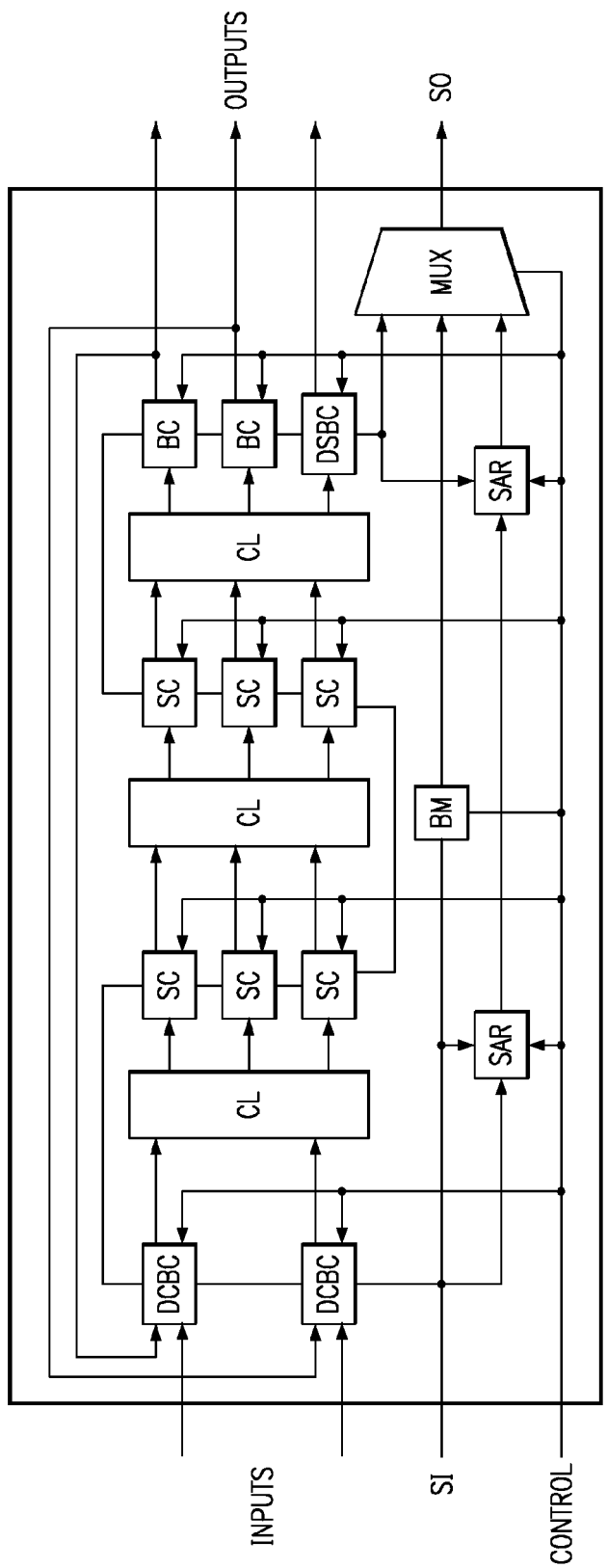
FIG. 30 illustrates the use of signature analyzer circuitry to execute a scan test methodology according to the present invention.

FIG. 30 illustrates one way to eliminate the possibility of aliasing as previously mentioned in regard to the data summing cell of FIGS. 12 and 13 by using conventional signature analyzers (SARs) at the serial input and serial output of a circuit's scan path. As mentioned earlier, aliasing can occur using the present invention if a first faulty response bit is shifted into a data summing cell and a second faulty response bit is summed with the first faulty bit during a capture operation. XOR gates, which are used broadly in testing using signature analysis, have the distinction of outputting a 1 if the inputs are 10 or 01, or outputting a 0 if the inputs are 11 or 00, which is the root of the aliasing problem. Placing an input signature analyzer on the serial input to the first cell of the circuit's scan path and placing an output signature analyzer on the serial output from the last cell of the circuit's scan path can detect for aliasing during use of DSC and DSBC.

In FIG. 30, it is seen that the input and output signature analyzers collect signature during each shift clock. If during the warping scan test, a faulty bit is shifted into the circuit, the input signature will be different from the expected signature. If during the warping scan test, a faulty bit is shifted out of the circuit, the output signature will be different from the expected signature. By shifting out the input and output signatures from each circuit at the end of the warping scan test, the tester can compare each circuit's input and output signatures to see if aliasing has occurred on the response data it has received from the circuits. If the tester finds that the response data is correct and the signatures are correct, the test is valid. If the tester finds that the response data is correct but the signatures are incorrect, the test is invalid.

The signatures also serve a very useful purpose in aiding the tester in identifying which circuit first introduced a fault. For example, if 100 circuits are tested and a fault is output from the 50th circuit, the tester can identify that the output signature of the 50th circuit failed and go directly to the circuit as the one which caused the other 50 circuits to fail. Upon repairing the 50th circuit, the test is repeated to see if any of the trailing 50 circuits fail, since their tests were invalidated in the previous test by the failure of the 50th circuit.

Alternately, each of the first 50 circuits, the first 49 of which passed while the 50th failed, can be bypassed. Then, the warping scan test concept can be applied to circuits 51-100. Any faults detected in circuits 51-100 can then be located by using the signature analyzers again to determine which one of circuits 51-100 first introduced a fault. Once this fault-introducing circuit is identified, it can be bypassed along with all of the circuits preceding it. Thereafter, the warping scan test concept can be applied again to the circuits following the fault-introducing circuit. The above-described procedure can be repeated until either a pass or fail result is determined for each of the 100 circuits.

In general, when the testing of a given circuit is completed and the corresponding bypass memory is selected, the tester should disable the associated signature analyzers from taking further signature. Using this approach, all signature analyzers will have been disabled from taking further signature before the final response residue is shifted out of the warping scan path. As previously indicated, the contents of the signature analyzers can be scanned out to the tester as needed.

The signature analyzers also permit the option of receiving no test response at the tester during the entire time that the tester is shifting stimulus data into the warping scan path. When all stimulus data necessary for the desired test has been shifted from the tester into the warping scan path, then the tester can select the signature analyzer scan path, scan out the signatures from the signature analyzers, and use the signatures as test response to be compared to expected signatures.

The warping scan test concept becomes more and more effective in reducing test times as more circuits are added in series on the scan path. The opposite is true with conventional scan testing, i.e. conventional scan testing becomes less and less effective as more circuits are added in series. The examples in FIGS. 23-29 of using warping scan to test boards, boxes, systems, wafers, lots, and lot groups indicate how a company who produces these types of electrical products might exploit the benefit of this invention broadly and standardize its use at every manufacturing level. Also an advantage of the invention is that one simple tester could be used at every manufacturing level within a company, from die testing to missile testing.

Although this disclosure has treated circuits as all being on the same scan path, if parallel scan paths were used to test circuits using the warping scan test concept, additional reductions in test time will be seen.

Figure 31:
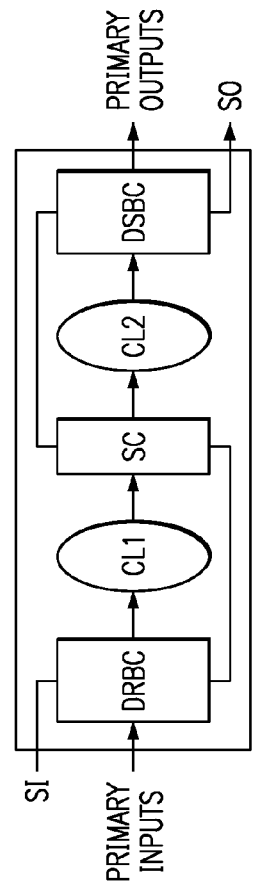
FIG. 31 illustrates the use of data retaining boundary scan cells and data summing boundary scan cells to scan test a target circuit according to the present invention.

Example FIG. 31 is similar to FIG. 16 except the DCBCs and BCs of FIG. 16 are replaced in FIG. 31 by DRBCs and DSBCs, respectively. The response captured from target circuits CL1 and CL2 is shifted out form SO to the SI input of a trailing circuit, as shown for example in FIGS. 23 and 26. The scan path of the trailing circuit is thus filled with the response captured from the leading circuit. If the circuits under test are all identical, the output response from the leading circuit will exactly fill the scan path of the trailing circuit. Also, each bit position will be the same in the scan paths of both circuits. So, after each shift operation in the warping scan operation, the bit positions of the DRBC, SC and DSBC scan path sections of the trailing circuit will be filled with the data just previously captured into the leading circuit's DRBC, SC and DSBC scan path sections, respectively. Recalling from FIG. 20 that the DRBC captures its own output, it is clear that during warping scan operation, stimulus data that fills the DRBCs of the first circuit will be captured back into the DRBCs of the first circuit and then shifted to fill the DRBCs of each successive trailing circuit during each successive shift operation. More specifically, the first stimulus data pattern that fills the DRBCs of the first circuit will be used as stimulus for the first circuit, and will thereafter be shifted to fill the DRBCs of the second circuit and reused as stimulus for the second circuit, and will thereafter be shifted to fill the DRBCs of the third circuit and reused as stimulus for the third circuit, and so on. Likewise, subsequent stimulus data patterns that fill the DRBCs of the first circuit are successively reused as stimulus by the DRBCs of the trailing circuits. The DRBCs of the first circuit will definitely receive from the tester all stimulus patterns necessary to completely test target CL1 of the first circuit (see FIG. 31). During warping scan operation, the target CL1 of each trailing circuit will also receive those same stimulus patterns as generated by the tester. Because response data at the primary outputs in FIG. 31 cannot be captured by the DRBCs, DSBCs are provided at the primary outputs to capture and compress response data.

Although exemplary embodiments of the present invention are described above, this description does not limit the scope of the invention, which can be practiced in a variety of embodiments.

APPENDIX

EXAMPLE 1

|  | SI | C1 ABC | C2 ABC | C3 ABC | SO |  |
|---|---|---|---|---|---|---|
| PS1 |  | 000 | 000 | 000 |  |  |
| CP1 |  | 010 | 001 | 011 |  | TESTS: C1 000-010, C2 000-001, C3 000-011 DECODE |
| SH1 | 001001001 | 001 | 001 | 001 | 010001011 |  |
| PS2 |  | 001 | 001 | 001 |  |  |
| CP2 |  | 010 | 110 | 010 |  | TESTS: C1 001-010, C2 001-110, C3 001-010 DECODE |
| SH2 | 010010010 | 010 | 010 | 010 | 010110010 |  |
| PS3 |  | 010 | 010 | 010 |  |  |
| CP3 |  | 011 | 011 | 101 |  | TESTS: C1 010-011, C2 010-011, C3 010-101 DECODE |
| SH3 | 011011011 | 011 | 011 | 011 | 011011101 |  |
| PS4 |  | 011 | 011 | 011 |  |  |
| CP4 |  | 110 | 100 | 100 |  | TESTS: C1 011-110, C2 011-100, C3 011-100 DECODE |
| SH4 | 100100100 | 100 | 100 | 100 | 110100100 |  |
| PS5 |  | 100 | 100 | 100 |  |  |
| CP5 |  | 101 | 101 | 101 |  | TESTS: C1 100-101, C2 100-101, C3 100-101 DECODE |
| SH5 | 101101101 | 101 | 101 | 101 | 101101101 |  |
| PS6 |  | 101 | 101 | 111 |  |  |
| CP6 |  | 110 | 110 | 000 |  | TESTS: C1 101-110, C2 101-110, C3 101-111 DECODE |
| SH6 | 110110110 | 110 | 110 | 110 | 110110000 |  |
| PS7 |  | 110 | 110 | 110 |  |  |
| CP7 |  | 011 | 111 | 111 |  | TESTS: C1 110-011, C2 110-111, C3 110-111 DECODE |
| SH7 | 111111111 | 111 | 111 | 111 | 011111111 |  |
| PS8 |  | 111 | 111 | 111 |  |  |
| CP8 |  | 110 | 100 | 000 |  | TESTS: C1 111-110, C2 111-100, C3 111-000 DECODE |
| SH8 | xxxxxxxxx | xxx | xxx | xxx | 110100000 |  |

| C1 TABLE ||||
|---|---|---|
| PS ABC | DEF | NS ABC |
| 000 | 010 | 010 |
| 001 | 010 | 010 |
| 010 | 011 | 011 |
| 011 | 110 | 110 |
| 100 | 101 | 101 |
| 101 | 110 | 110 |
| 110 | 011 | 011 |
| 111 | 110 | 110 |

C2 TABLE

| PS ABC | DEF | NS ABC |
|---|---|---|
| 000 | 001 | 001 |
| 001 | 110 | 110 |
| 010 | 011 | 011 |
| 011 | 100 | 100 |
| 100 | 101 | 101 |
| 101 | 110 | 110 |
| 110 | 111 | 111 |
| 111 | 100 | 100 |

C3 TABLE

| PS ABC | DEF | NS ABC |
|---|---|---|
| 000 | 011 | 011 |
| 001 | 010 | 010 |
| 010 | 101 | 101 |
| 011 | 100 | 100 |
| 100 | 101 | 101 |
| 101 | 111 | 111 |
| 110 | 111 | 111 |
| 111 | 000 | 000 |

CONVENTIONAL SCAN TEST CLOCKS=CAPTURE CLOCKS=SHIFT CLOCKS=8+72=80

EXAMPLE 2

```
         SI      C1      C2      C3      SO
                 ABC     ABC     ABC
   PS1           000     000     000
   CP1           010 ─┐  001 ─┐  011 ─┐
   SH1   001 ──▶ 001  ▶ 010   ▶ 001   ▶ 011     TESTS: C1 000-010, C2 000-001,
                                                        C3 000-011 DECODE

PS2           001     010     001
   CP2           010 ─┐  011 ─┐  010 ─┐
   SH2   010 ──▶ 010  ▶ 010   ▶ 011   ▶ 010     TESTS: C1 001-010, C2 010-011,
                                                        C3 001-010 DECODE

PS3           010     010     011
   CP3           011 ─┐  011 ─┐  100 ─┐
   SH3   011 ──▶ 011  ▶ 011   ▶ 011   ▶ 100     TESTS: C1 010-011, C2 010-011,
                                                        C3 011-100 DECODE

PS4           011     011     011
   CP4           110 ─┐  100 ─┐  100 ─┐
   SH4   100 ──▶ 100  ▶ 110   ▶ 100   ▶ 100     TESTS: C1 011-110, C2 011-100,
                                                        C3 011-100 DECODE

PS5           100     110     100
   CP5           101 ─┐  111 ─┐  101 ─┐
   SH5   101 ──▶ 101  ▶ 101   ▶ 111   ▶ 101     TESTS: C1 100-101, C2 110-111,
                                                        C3 100-101 DECODE

PS6           101     101     111
   CP6           110 ─┐  110 ─┐  000 ─┐
   SH6   110 ──▶ 110  ▶ 110   ▶ 110   ▶ 000     TESTS: C1 101-110, C2 101-110,
                                                        C3 111-000 DECODE

PS7           110     110     110
   CP7           011 ─┐  111 ─┐  111 ─┐
   SH7   111 ──▶ 111  ▶ 011   ▶ 111   ▶ 111     TESTS: C1 110-011, C2 110-111,
                                                        C3 110-111 DECODE

PS8           111     011     111
   CP8           110 ─┐  100 ─┐  000 ─┐          TESTS: C1 111-110, C2 011-100,
   SH8   1XX ──▶ (11)  ▶ 110   ▶ 100   ▶ 000     C3 111-000 DECODE LOADS C1'S BM WITH
                                                        FIRST BIT OF C2'S 001 STIMULUS

PS9           HHH     110     100
   CP9           HHH     111 ─┐  101 ─┐          TESTS: C2 110-111, C3 100-101 DECODE
   SH9   (00) ──▶(0)  ─▶ 001   ▶ 111   ▶ 101     BYPASS C1 AND HOLD (H) C1'S SCAN PATH
                                                        LOAD C2'S REMAINING 001 STIMULUS

PS10          HHH     001     111
   CP10          HHH     110 ─┐  000 ─┐          TESTS: C2'S REMAINING 001-110, C3 111-000
   SH10  1(0) ──▶(11) ─▶ 100   ▶ 110   ▶ 000     DECODE LOADS C1'S BM
                                                        WITH FIRST BIT OF C2'S 111 STIMULUS

PS11          HHH     100     110
   CP11          HHH     101 ─┐  111 ─┐
   SH11  X(1) ──▶(X) ─▶ 111   ▶ 101   ▶ 111     TESTS: C2'S REMAINING 100-011,
                                                        C3 110-111 DECODE

PS12          HHH     111     101
   CP12          HHH     100 ─┐  111 ─┐          TESTS: REMAINING C2 111-100 AND C3
   SH12  (0X) ──▶(1) ─▶ (0)   ▶ 100   ▶ 111     101-111 DECODE LOADS C1'S AND C2'S
                                                 BM WITH FIRST 2 BITS OF C3'S 010 STIMULUS

PS13          HHH     HHH     100
   CP13          HHH     HHH     101 ─┐          BYPASS C2 AND HOLD (H) C2'S SCAN
   SH13  XX0 ──▶(X) ─▶(X) ─▶ 010   ▶ 101        PATH LOAD C3'S REMAINING 010 STIMULUS

PS14          HHH     HHH     010
   CP14          HHH     HHH     101 ─┐
   SH14  XXX ──▶ X  ──▶ X  ──▶ XXX   ▶ 101       TESTS: C3'S REMAINING 010-101 DECODE
```

C1 TABLE
| PS ABC | DEF | NS ABC |
|---|---|---|
| 000 | 010 | 010 |
| 001 | 010 | 010 |
| 010 | 011 | 011 |
| 011 | 110 | 110 |
| 100 | 101 | 101 |
| 101 | 110 | 110 |
| 110 | 011 | 011 |
| 111 | 110 | 110 |
C2 TABLE
| PS ABC | DEF | NS ABC |
|---|---|---|
| 000 | 001 | 001 |
| 001 | 110 | 110 |
| 010 | 011 | 011 |
C3 TABLE
| PS ABC | DEF | NS ABC |
|---|---|---|
| 000 | 011 | 011 |
| 001 | 010 | 010 |
| 010 | 101 | 101 |
| 011 | 100 | 100 |
| 100 | 101 | 101 |
| 101 | 111 | 111 |
| 110 | 111 | 111 |
| 111 | 000 | 000 |
WARPING SCAN TEST CLOCKS=CAPTURE CLOCKS+SHIFT CLOCKS=14+42=56
CONVENTIONAL SCAN TEST CLOCKS=CAPTURE CLOCKS+SHIFT CLOCKS=8+72=80
EXAMPLE 3
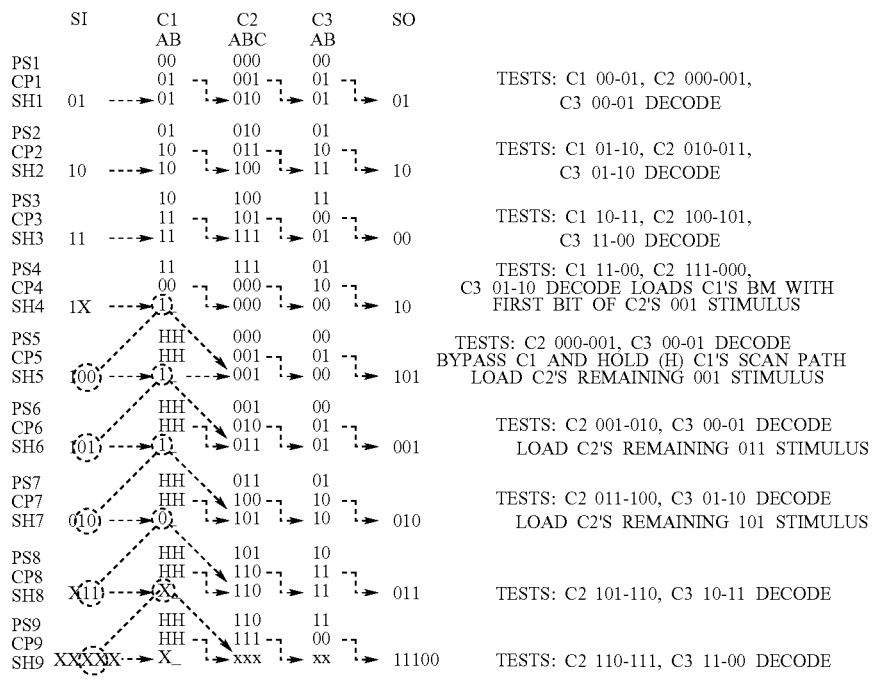
C2 TABLE-continued
| PS ABC | DEF | NS ABC |
|---|---|---|
| 011 | 100 | 100 |
| 100 | 101 | 101 |
| 101 | 110 | 110 |
| 110 | 111 | 111 |
| 111 | 100 | 100 |
C1 TABLE
| PS AB | CD | NS AB |
|---|---|---|
| 00 | 01 | 01 |
| 01 | 10 | 10 |
| 10 | 11 | 11 |
| 11 | 00 | 00 |

C2 TABLE

| PS ABC | DEF | NS ABC |
|---|---|---|
| 000 | 001 | 001 |
| 001 | 010 | 010 |
| 010 | 011 | 011 |
| 011 | 100 | 100 |
| 100 | 101 | 101 |
| 101 | 110 | 110 |
| 110 | 111 | 111 |
| 111 | 000 | 100 |

C3 TABLE

| PS AB | CD | NS AB |
|---|---|---|
| 00 | 01 | 01 |
| 01 | 10 | 10 |
| 10 | 11 | 11 |
| 11 | 00 | 00 |

WARPING SCAN TEST CLOCKS=CAPTURE CLOCKS+SHIFT CLOCKS=9+25=34
CONVENTIONAL SCAN TEST CLOCKS=CAPTURE CLOCKS+SHIFT CLOCKS=8+56=64

EXAMPLE 4

C1 TABLE

| PS ABC | DEF | NS ABC |
|---|---|---|
| 000 | 001 | 001 |
| 001 | 010 | 010 |
| 010 | 011 | 011 |
| 011 | 100 | 100 |
| 100 | 101 | 101 |
| 101 | 110 | 110 |
| 110 | 111 | 111 |
| 111 | 000 | 000 |

C2 TABLE

| PS AB | CD | NS AB |
|---|---|---|
| 00 | 01 | 01 |
| 01 | 10 | 10 |
| 10 | 11 | 11 |
| 11 | 00 | 00 |

```
         SI      C1      C2      C3      SO
                 ABC     AB      AB
PS1              000     00      00
CP1              001 -,  01 -,   01 -,
SH1      001-► 001  ┆► 00  ┆► 10  ┆► 101       TESTS: C1 000-001, C2 00-01,
                                                      C3 00-01 DECODE

PS2              001     00      10
CP2              010 -,  01 -,   11 -,
SH2      010-► 010  ┆► 01  ┆► 00  ┆► 111       TESTS: C1 001-010, C2 00-01,
                                                      C3 10-11 DECODE

PS3              010     01      00
CP3              011 -,  10 -,   01 -,
SH3      011-► 011  ┆► 01  ┆► 11  ┆► 001       TESTS: C1 010-011, C2 01-10,
                                                      C3 00-01 DECODE

PS4              011     01      11
CP4              100 -,  10 -,   00 -,
SH4      100-► 100  ┆► 10  ┆► 01  ┆► 000       TESTS: C1 011-100, C2 01-10,
                                                      C3 11-00 DECODE

PS5              100     10      01
CP5              101     11 -,   10 -,
SH5      101-► 101----► 10  ┆► 11  ┆► 110       TESTS: C1 100-101, C2 10-11,
                                                      C3 01-10 DECODE

PS6              101     10      11
CP6              110 -,  11 -,   00 -,
SH6      110-► 110  ┆► 11  ┆► 01  ┆► 100       TESTS: C1 101-110, C2 10-11,
                                                      C3 11-00 DECODE

PS7              110     11      01
CP7              111 -,  00 -,   10 -,
SH7      111-► 111  ┆► 11  ┆► 10  ┆► 010       TESTS: C1 110-111, C2 11-00,
                                                      C3 01-10 DECODE

PS8              111     11      10
CP8              000 -,  00 -,   11 -,
SH8  xxxxxxx-► xxx ┆► xx  ┆► xx  ┆► 0000011    TESTS: C1 111-000, C2 11-00,
                                                      C3 10-11 DECODE
```

C3 TABLE

| PS<br>AB | CD | NS<br>AB |
|---|---|---|
| 00 | 01 | 01 |
| 01 | 10 | 10 |
| 10 | 11 | 11 |
| 11 | 00 | 00 |

WARPING SCAN TEST CLOCKS=CAPTURE CLOCKS+SHIFT CLOCKS=8+28=36
CONVENTIONAL SCAN TEST CLOCKS=CAPTURE CLOCKS+SHIFT CLOCKS=8+56=64

EXAMPLE 5

```
        SI      C1       C2      SO
               ABC      ABC
PS1            000      000
CP1            001 ┐    010 ┐
SH1    001 --► 001 └► 001 └► 010        TESTS: C1 000-001,
                                        C2 000-010 DECODE
PS2            001      001
CP2            010 ┐    011 ┐
SH2    010 --► 010 └► 010 └► 011        TESTS: C1 001-010,
                                        C2 001-011 DECODE
PS3            010      010
CP3            011 ┐    100 ┐
SH3    011 --► 011 └► 011 └► 100        TESTS: C1 010-011,
                                        C2 010-100 DECODE
PS4            011      011
CP4            100 ┐    101 ┐
SH4    100 --► 100 └► 100 └► 101        TESTS: C1 011-100,
                                        C2 011-101 DECODE
PS5            100      100
CP5            101 ┐    110 ┐
SH5    101 --► 101 └► 101 └► 110        TESTS: C1 100-101,
                                        C2 100-110 DECODE
PS6            101      101
CP6            110 ┐    111 ┐
SH6    110 --► 110 └► 110 └► 111        TESTS: C1 101-110,
                                        C2 101-111 DECODE
PS7            110      110
CP7            111 ┐    000 ┐
SH7    111 --► 111 └► 111 └► 010        TESTS: C1 110-111,
                                        C2 110-000 DECODE
PS8            111      111
CP8            000 ┐    001 ┐
SH8  xxxxxx --► xxx └► 000 └► 000001    TESTS: C1 111-000,
                                        C2 111-001 DECODE
```

C1 TABLE

| PS<br>ABC | DEF | NS<br>ABC |
|---|---|---|
| 000 | 001 | 001 |
| 001 | 010 | 010 |
| 010 | 011 | 011 |
| 011 | 100 | 100 |
| 100 | 101 | 101 |
| 101 | 110 | 110 |
| 110 | 111 | 111 |
| 111 | 000 | 000 |

C2 TABLE

| PS<br>ABC | DEF | NS<br>ABC |
|---|---|---|
| 000 | 010 | 010 |
| 001 | 010 | 011 |
| 010 | 100 | 100 |
| 011 | 100 | 101 |
| 100 | 110 | 110 |
| 101 | 110 | 111 |
| 110 | 000 | 000 |
| 111 | 000 | 001 |

WARPING SCAN TEST CLOCKS=CAPTURE CLOCKS+SHIFT CLOCKS=8+27=35 CONVENTIONAL SCAN TEST CLOCKS=CAPTURE CLOCKS+SHIFT CLOCKS=8+48=56

EXAMPLE 6

```
        SI      C1       C2      SO
               ABC      ABC
PS1            000      000
CP1            001 ┐    010 ┐
SH1    001 --► 001 └► 001 └► 010        TESTS: C1 000-001,
                                        C2 000-010 DECODE
PS2            001      001
CP2            010 ┐    101 ┐
SH2    010 --► 010 └► 010 └► 101        TESTS: C1 001-010,
                                        C2 001-101 DECODE
PS3            010      010
CP3            011 ┐    110 ┐
SH3    011 --► 011 └► 011 └► 110        TESTS: C1 010-011,
                                        C2 010-110 DECODE
PS4            011      011
CP4            100 ┐    001 ┐
SH4    100 --► 100 └► 100 └► 001        TESTS: C1 011-100,
                                        C2 011-001 DECODE
PS5            100      100
CP5            101      010
SH5    101 --►101----►101----► 010      TESTS: C1 100-101,
                                        C2 100-010 DECODE
PS6            101      101
CP6            110 ┐    101 ┐
SH6    110 --► 110 └► 110 └► 101        TESTS: C1 101-110,
                                        C2 101-101 DECODE
PS7            110      110
CP7            111 ┐    110 ┐
SH7    111 --► 111 └► 111 └► 110        TESTS: C1 110-111,
                                        C2 110-110 DECODE
PS8            111      111
CP8            000 ┐    001 ┐
SH8  xxxxxx --► xxx └► 000 └► 000001    TESTS: C1 111-000,
                                        C2 111-001 DECODE
```

C1 TABLE

| PS<br>ABC | DEF | NS<br>ABC |
|---|---|---|
| 000 | 001 | 001 |
| 001 | 010 | 010 |
| 010 | 011 | 011 |
| 011 | 100 | 100 |
| 100 | 101 | 101 |
| 101 | 110 | 110 |
| 110 | 111 | 111 |
| 111 | 000 | 000 |

C2 TABLE

| PS<br>ABC | DE | NS<br>ABC |
|---|---|---|
| 000 | 01 | 010 |
| 001 | 10 | 101 |
| 010 | 11 | 110 |
| 011 | 00 | 001 |
| 100 | 01 | 010 |
| 101 | 10 | 101 |
| 110 | 11 | 110 |
| 111 | 00 | 001 |

WARPING SCAN TEST CLOCKS=CAPTURE CLOCKS+SHIFT CLOCKS=8+27=35
CONVENTIONAL SCAN TEST CLOCKS=CAPTURE CLOCKS+SHIFT CLOCKS=8+48=56

EXAMPLE 7

```
         SI      Cl_1      Cl_2              Cl_{N-1}   Cl_N       SO
                 ABC       ABC                ABC       ABC
PS1              000       000                000       000
CP1              001 --,   001 --,            001 --,   001 --,
SH1     001 ---→001  ⇨    001  ⇨   001 ---→001  ⇨     001  ⇨    001

PS2              001       001                001       001
CP2              010 --,   010 --,            010 --,   010 --,
SH2     010 ---→010  ⇨    010  ⇨   010 ---→010  ⇨     010  ⇨    010

PS3              010       010                010       010
CP3              011 --,   011 --,            011 --,   011 --,
SH3     011 ---→011  ⇨    011  ⇨   011 ---→011  ⇨     011  ⇨    011

PS4              011       011                011       011
CP4              100 --,   100 --,            100 --,   100 --,
SH4     100 ---→100  ⇨    100  ⇨   100 ---→100  ⇨     100  ⇨    100

PS5              100       100                100       100
CP5              101 --,   101 --,            101 --,   101 --,
SH5     101 ---→101  ⇨    101  ⇨   101 ---→101  ⇨     101  ⇨    101

PS6              101       101                101       101
CP6              110 --,   110 --,            110 --,   110 --,
SH6     110 ---→110  ⇨    110  ⇨   110 ---→110  ⇨     110  ⇨    110

PS7              110       110                110       110
CP7              111 --,   111 --,            111 --,   111 --,
SH7     111 ---→111  ⇨    111  ⇨   111 ---→111  ⇨     111  ⇨    111

PS8              111       111                111       111
CP8              000 --,   000 --,            000 --,   000 --,
SH8  xxx..xxx-→xxx  ⇨     xxx  ⇨  000000 -→xxx  ⇨     xxx  ⇨   000..000
```

WARPING SCAN TEST CLOCKS=P(C+L)+NL−L
CONVENTIONAL SCAN TEST CLOCKS=P(C+NL)
FOR LARGE L AND P
WARPING SCAN TEST CLOCKS=(P+(N−1))
CONVENTIONAL SCAN TEST CLOCKS=LPN
FOR L=2000, P=1000, N=1
WARPING SCAN TEST CLOCKS=2,000,000
CONVENTIONAL SCAN TEST CLOCKS=200,000,000
FOR L=2000, P=1000, N=100
WARPING SCAN TEST CLOCKS=2,198,000
CONVENTIONAL SCAN TEST CLOCKS=200,000,000
FOR L=2000, P=1000, N=1000
WARPING SCAN TEST CLOCKS=3,998,000
CONVENTIONAL SCAN TEST CLOCKS=2,000,000,000

C1 TABLE

| PS ABC | DEF | NS ABC |
|--------|-----|--------|
| 000 | 001 | 001 |
| 001 | 010 | 010 |

C1 TABLE-continued

| PS ABC | DEF | NS ABC |
|--------|-----|--------|
| 010 | 011 | 011 |
| 011 | 100 | 100 |
| 100 | 101 | 101 |
| 101 | 110 | 110 |
| 110 | 111 | 111 |
| 111 | 000 | 000 |

P=CIRCUIT'S TEST PATTERN COUNT
L=CIRCUIT'S SCAN PATH LENGTH
C=CAPTURE CLOCK PER TEST PATTERN
N=NUMBER OF CIRCUITS

EXAMPLE 8

```
         SI      Cl_1      Cl_2              Cl_{N-1}   Cl_N       SO
                 ABC       ABC                ABC       ABC
PS1              000       000                000       000
CP1              001 --,   001 --,            001 --,   001 --,
SH1     001 ---→001  ⇨    001  ⇨   010 ---→001  ⇨     001  ⇨    001

PS2              001       001                001       001
CP2              010 --,   010 --,            010 --,   010 --,
SH2     010 ---→010  ⇨    010  ⇨   010 ---→010  ⇨     010  ⇨    010

PS3              010       010                010       010
CP3              xxx --,   xxx --,            xxx --,   xxx --,
SH3  011..011-→011  ⇨     011  ⇨  xxxxxx---→011  ⇨    011  ⇨   xxx..xxx PS4              011       011                011       011
CP4              100 --,   100 --,            100 --,   100 --,
SH4     100 ---→100  ⇨    100  ⇨   100 ---→100  ⇨     100  ⇨    100
```

```
PS5         100       100                100       100
CP5         101 -,    101 -,             101 -,    101 -,
SH5  101 --→101  !→   101  !→  101 ---→101  !→    101  !→   101

PS6         101       101                101       101
CP6         xxx -,    xxx -,             110 -,    110 -,
SH6  110..110-→110 !→ 110  !→  xxxxxx--→110 !→    110  !→   xxx..xxx PS7         110       110                110       110
CP7         111 -,    111 -,             111 -,    111 -,
SH7  111 ---→111  !→  111  !→  111 ---→111  !→    111  !→   111

PS8         111       111                111       111
CP8         000 -,    000 -,             000 -,    000 -,
SH8  xxx..xxx-→xxx !→ xxx  !→  000000 -→ xxx !→   xxx  !→   000..000
```

C1 TABLE

| PS<br>ABC | DEF | NS<br>ABC |
|---|---|---|
| 000 | 001 | 001 |
| 001 | 010 | 010 |
| 010 | XXX | XXX |
| 011 | 100 | 100 |
| 100 | 101 | 101 |
| 101 | XXX | XXX |
| 110 | 111 | 111 |
| 111 | 000 | 000 |

C1 TABLE-continued

| PS<br>ABC | DEF | NS<br>ABC |
|---|---|---|
| 100 | 101 | 101 |
| 101 | 110 | 110 |
| 110 | 111 | 111 |
| 111 | 000 | 000 |

EXAMPLE 9

```
       SI    C1_1    C1_2           C1_{N-1}  C1_N    SO
             ABC     ABC            ABC       ABC
PS1          000     000            000       000
CP1          001 -,  001 -,         001 -,    001 -,
SH1   001 --→001 !→  001 !→  001 --→001 !→    001 !→  001

PS2          001     001            001       001
CP2          001 -,  001 -,         001 -,    001 -,
SH2   01  --→010 !→  010 !→  01  --→010 !→    010 !→  01

PS3          010     010            010       010
CP3          011 -,  011 -,         011 -,    011 -,
SH3   011 --→011 !→  011 !→  011 --→011 !→    011 !→  011

PS4          011     011            011       011
CP4          100 -,  100 -,         100 -,    100 -,
SH4   100 --→100 !→  100 !→  100 --→100 !→    100 !→  100

PS5          100     100            100       100
CP5          101 -,  101 -,         101 -,    101 -,
SH5   101 --→101 !→  101 !→  101 --→101 !→    101 !→  101

PS6          101     101            101       101
CP6          110 -,  110 -,         110 -,    110 -,
SH6   110 --→110 !→  110 !→  110 --→110 !→    110 !→  110

PS7          110     110            110       110
CP7          111 -,  111 -,         111 -,    111 -,
SH7   111 --→111 !→  111 !→  111 --→111 !→    111 !→  111

PS8          111     111            111       111
CP8          000 -,  000 -,         000 -,    000 -,
SH8   xxx..xxx-→xxx !→ xxx !→ 000000 -→xxx !→  xxx !→  000..000
```

C1 TABLE

| PS<br>ABC | DEF | NS<br>ABC |
|---|---|---|
| 000 | 001 | 001 |
| 001 | 001 | 001 |
| 010 | 011 | 011 |
| 011 | 100 | 100 |

What is claimed is:

1. A process of generating test stimulus patterns for use in scan testing target circuitry, comprising:

A. applying a control signal to the target circuitry to place the target circuitry in a preset state;

B. capturing a first response pattern from the target circuitry produced in response to the target circuitry being placed in a preset state; and C. applying the first response pattern to the target circuitry as a first stimulus pattern.

2. The process of claim 1 in which the applying a control signal includes applying a reset signal to place the target circuitry in a known, reset state.

3. The process of claim 1 in which the applying a control signal includes applying a control signal to target circuitry that is combinational logic.

4. The process of claim 1 in which the capturing includes capturing a first response pattern in a scan path.

5. The process of claim 1 in which the applying the first response pattern to the target circuitry as a first stimulus pattern includes shifting the first response pattern along a scan path.

6. The process of claim 1 in which:
   i. the capturing a first response pattern includes capturing the first response pattern in a scan path, and
   ii. the applying the first response pattern to the target circuitry as a first stimulus pattern includes shifting a second stimulus pattern into the scan path while shifting the first response pattern along the scan path, and including:
   iii. applying the second stimulus pattern to the target circuitry to produce a second response pattern.

7. The process of claim 1 in which:
   i. the capturing a first response pattern includes capturing the first response pattern in a scan path, and
   ii. the applying the first response pattern to the target circuitry as a first stimulus pattern includes shifting a second stimulus pattern into the scan path while shifting the first response pattern along the scan path, and including:
   iii. applying the second stimulus pattern to the target circuitry to produce a second response pattern, and
   iv. repeating both the shifting a stimulus pattern into the scan path while shifting the response pattern along the scan path, and the applying the response pattern to the target circuitry as a stimulus pattern.

\* \* \* \* \*